(12) United States Patent
Nakajima et al.

(10) Patent No.: US 9,368,661 B2
(45) Date of Patent: Jun. 14, 2016

(54) PHOTODETECTOR

(71) Applicant: HAMAMATSU PHOTONICS K.K., Hamamatsu-shi, Shizuoka (JP)

(72) Inventors: Kazutoshi Nakajima, Hamamatsu (JP); Toru Hirohata, Hamamatsu (JP); Minoru Niigaki, Hamamatsu (JP); Wataru Akahori, Hamamatsu (JP); Kazuue Fujita, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 13/899,940

(22) Filed: May 22, 2013

(65) Prior Publication Data

US 2013/0320470 A1    Dec. 5, 2013

Related U.S. Application Data

(60) Provisional application No. 61/721,132, filed on Nov. 1, 2012.

(30) Foreign Application Priority Data

Jun. 5, 2012 (JP) ................................. 2012-128069

(51) Int. Cl.
*H01L 27/14* (2006.01)
*H01L 31/0352* (2006.01)
(Continued)

(52) U.S. Cl.
CPC ............. *H01L 31/0352* (2013.01); *B82Y 20/00* (2013.01); *H01L 27/1446* (2013.01); *H01L 31/035236* (2013.01); *H01L 31/09* (2013.01); *H01L 27/14649* (2013.01)

(58) Field of Classification Search
CPC .................. H01L 31/105; H01L 31/00–31/20
USPC ............. 257/431–437, E31, E31.04, E31.12, 257/449; 438/48, 54, 69
See application file for complete search history.

(56) References Cited

U.S. PATENT DOCUMENTS 5,485,015 A * 1/1996 Choi ................... H01L 31/0236
250/338.4
6,054,718 A * 4/2000 Dodd ........................ H01J 1/34
257/10

(Continued)

FOREIGN PATENT DOCUMENTS

JP    2007-248141 A    9/2007
JP    2007-266541 A    10/2007

(Continued)

OTHER PUBLICATIONS

English translation of FP: JP 2007273832 A.*

(Continued)

*Primary Examiner* — Amar Movva
*Assistant Examiner* — Sheikh Maruf
(74) *Attorney, Agent, or Firm* — Drinker Biddle & Reath LLP

(57) ABSTRACT

A photodetector 1A comprises a multilayer structure 3 having a first layer 4 constituted by first metal or first semiconductor, a semiconductor structure layer 5 mounted on the first layer 4 and adapted to excite an electron by plasmon resonance, and a second layer 6 mounted on the semiconductor structure layer 5 and constituted by second metal or second semiconductor.

7 Claims, 29 Drawing Sheets

(51) Int. Cl.
*H01L 27/144* (2006.01)
*H01L 31/09* (2006.01)
*B82Y 20/00* (2011.01)
*H01L 27/146* (2006.01)

(56) References Cited

U.S. PATENT DOCUMENTS

| | | | |
|---|---|---|---|
| 2002/0135035 A1* | 9/2002 | Yamaguchi | H01L 31/1035 257/440 |
| 2003/0141507 A1* | 7/2003 | Krames | H01L 33/08 257/79 |
| 2004/0188793 A1* | 9/2004 | Lindemann | H01L 27/1463 257/457 |
| 2006/0151807 A1* | 7/2006 | Pardo | H01L 31/0232 257/184 |
| 2007/0058982 A1* | 3/2007 | Onishi | B82Y 20/00 398/152 |
| 2007/0194401 A1* | 8/2007 | Nagai | H01L 27/14623 257/447 |
| 2007/0262239 A1* | 11/2007 | Niigaki et al. | 250/208.1 |
| 2008/0073743 A1* | 3/2008 | Alizadeh | B82Y 10/00 257/461 |
| 2009/0008735 A1* | 1/2009 | Ogino et al. | 257/436 |
| 2009/0134486 A1* | 5/2009 | Fujikata | 257/449 |
| 2009/0267169 A1* | 10/2009 | Kikuchi | 257/432 |
| 2010/0013040 A1* | 1/2010 | Okamoto et al. | 257/432 |
| 2010/0308428 A1* | 12/2010 | Okamoto | H01L 31/03529 257/432 |
| 2012/0032292 A1* | 2/2012 | Le Perchec | H01L 31/022408 257/436 |

FOREIGN PATENT DOCUMENTS

| | | |
|---|---|---|
| JP | 2007-273832 A * | 10/2007 |
| JP | 2007-273832 A | 10/2007 |
| JP | 2007273832 A * | 10/2007 |
| JP | 2009-038352 A | 2/2009 |
| JP | 2012-083238 A | 4/2012 |
| WO | WO-2009/088071 A1 | 7/2009 |
| WO | WO-2010/072942 A1 | 7/2010 |

OTHER PUBLICATIONS

Jheng-Han Lee et al., "Two-Color Quantum-Dot Infrared Photodetectors With Periodic Cross Metal Hole Array Contact", IEEE Photonics Technology Letters, vol. 22, No. 8, Apr. 15, 2010, p. 577-p. 579.

Debin Li et al., "All-semiconductor active plasmonic system in mid-infrared wavelengths", Optics Express, vol. 19, No. 15, Jul. 18, 2011, p. 14594-p. 14603.

Hideki T. Miyazaki et al., "Squeezing Visible Light Waves into a 3-nm-Thick and 55-nm-Long Plasmon Cavity", Physical Review Letters, 96, 2006, p. 097401.

Wei Wu et al., "Plasmonic enhanced quantum well infrared photodetector with high detectivity", Applied Physics Letters, 96, 2010, p. 161107-1-p. 161107-3.

English-language translation of International Preliminary Report on Patentability (IPRP) dated Dec. 18, 2014 that issued in WO Patent Application No. PCT/JP2013/060080.

English-language translation of International Preliminary Report on Patentability (IPRP) dated Dec. 18, 2014 that issued in WO Patent Application No. PCT/JP2012/078372.

* cited by examiner

Fig.3
(a)
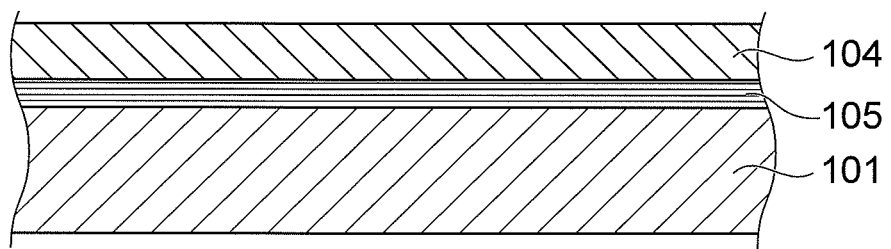
(b)
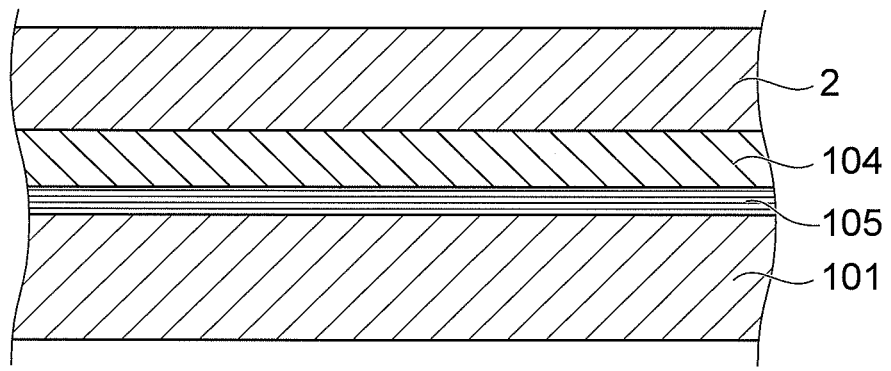

Fig.4
(a)
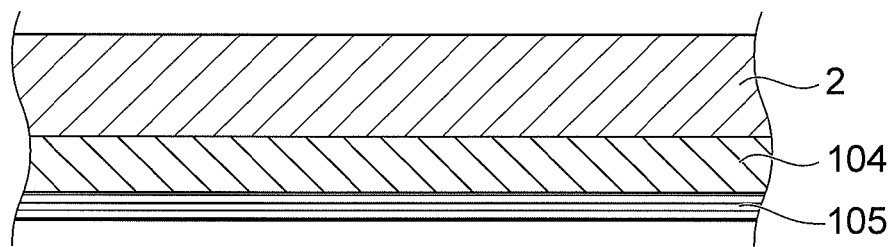
(b)
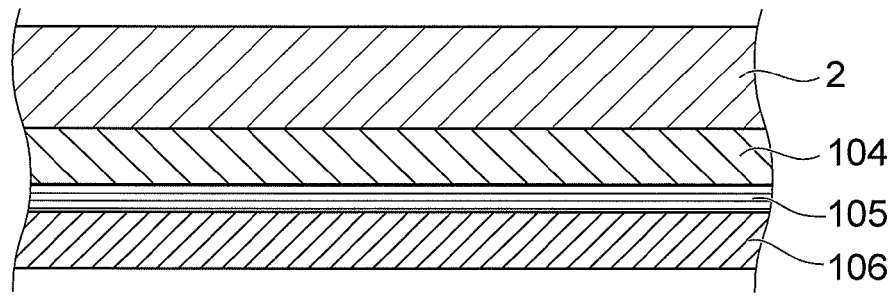

Fig.5
(a)
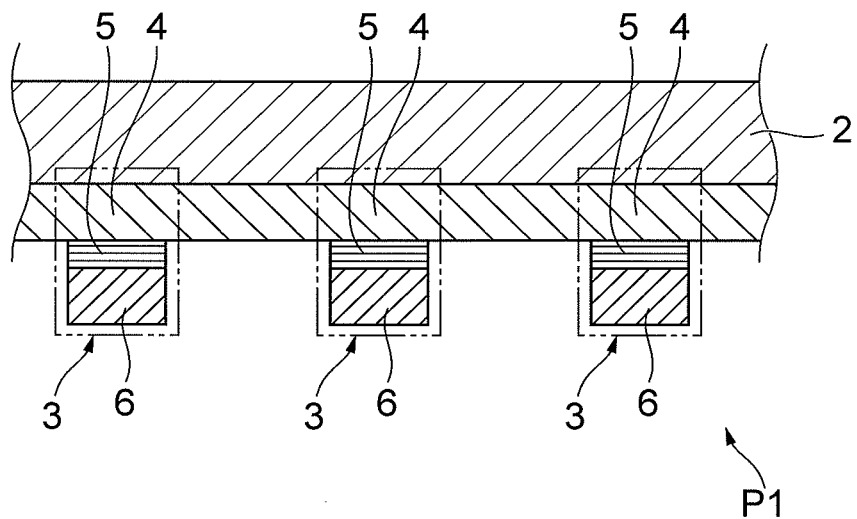
(b)
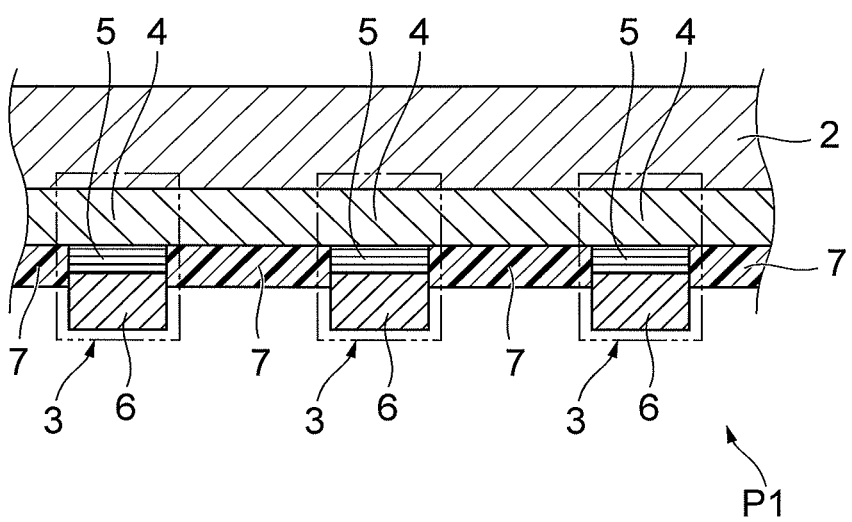

PHOTODETECTOR

CROSS-REFERENCE TO RELATED APPLICATION

This application claims priority to a Japanese Patent Application No. 2012-128069 filed on Jun. 5, 2012 and a Provisional Application No. 61/721,132 filed on Nov. 1, 2012 by the same Applicant, which are hereby incorporated by reference in their entirety.

BACKGROUND OF THE INVENTION

1. Field of the Invention

The present invention relates to a photodetector utilizing plasmon resonance.

2. Related Background Art

Known as photodetectors utilizing light absorption of quantum intersubband transitions are QWIP (quantum well type infrared optical sensor), QCD (quantum cascade type optical sensor), QDIP (quantum dot infrared optical sensor), and the like. They utilize no energy bandgap transitions and thus have such merits as high degree of freedom in designing wavelength ranges and capability of high-speed response.

Among these photodetectors, the QWIP and QCD are equipped with a semiconductor multilayer body having a periodic multilayer structure such as a quantum well structure or quantum cascade structure. This semiconductor multilayer body generates a current due to an electric field component in the stacking direction thereof only when light incident thereon has such an electric field component, thus being not photosensitive to light having no electric field component in the stacking direction (planar waves incident thereon in the stacking direction thereof).

Therefore, in order for the QWIP or QCD to detect light, it is necessary for the light to be incident thereon such that a direction of vibration of an electric field of the light coincides with the stacking direction of the semiconductor multilayer body. When detecting a planar wave having a wavefront perpendicular to an advancing direction of light, for example, it is necessary for the light to be incident on the semiconductor multilayer body in a direction perpendicular to its stacking direction, which makes the photodetector cumbersome to use.

There has hence been known a photodetector in which, for detecting light having no electric field component in the stacking direction of the semiconductor multilayer body, a thin gold film is disposed on a surface of the semiconductor multilayer body and periodically formed with holes each having a diameter not greater than the wavelength of the light (see W. Wu, et al., "Plasmonic enhanced quantum well infrared photodetector with high detectivity", Appl. Phys. Lett., 96, 161107 (2010)). In this example, the light is modulated so as to attain an electric field component in the stacking direction of the semiconductor multilayer body under a surface plasmonic resonance effect on the thin gold film.

Concerning the plasmon resonance, it has also been known that, when light is incident on a so-called MIM structure in which an insulator is held between metals, the electric field is remarkably enhanced by the plasmon resonance (see H. T. Miyazaki, Y. Kurokawa, "Squeezing Visible Light Waves into a 3-nm-Thick and 55-nm-Long Plasmon Cavity", Phys. Rev. Lett., 96, 097401 (2006)).

On the other hand, the QDIP has three-dimensional directions for light confinement and thus can eliminate polarization dependence, thereby being able to detect light independently of the vibration direction of the electric field of light.

However, the QDIP has a drawback in that it has intrinsically low photosensitivity due to its structure.

SUMMARY OF THE INVENTION

Thus, various techniques for modulating light so as to make it have a specific electric field component or enhancing the electric field have conventionally been proposed. On the other hand, photodetectors such as the QWIP, QCD, and QDIP utilizing light absorption of quantum intersubband transitions have various merits as mentioned above and thus are demanded to enhance their photosensitivity.

It is therefore an object of the present invention to provide a photodetector having high photosensitivity while using a semiconductor structure which can utilize light absorption of quantum intersubband transitions.

The photodetector of the present invention comprises a multilayer structure having a first layer constituted by first metal or first semiconductor, a semiconductor structure layer mounted on the first layer and adapted to excite an electron by plasmon resonance, and a second layer mounted on the semiconductor structure layer and constituted by second metal or second semiconductor.

In this photodetector, the multilayer structure acts as a cavity for causing surface plasmon resonance. Light polarized in the width direction of the cavity incident on the multilayer structure, if any, excites surface plasmons therein. The excited surface plasmons generate standing waves within the multilayer structure by plasmon resonance, thereby enhancing the electric field. The resulting electric field component excites electrons in the semiconductor structure layer, which are detected as a current. Therefore, this photodetector attains high photosensitivity as a photodetector using a semiconductor structure which can utilize light absorption of quantum intersubband transitions.

Here, the semiconductor structure may generate light absorption of a quantum intersubband transition. This utilizes no energy bandgap transitions, which makes the photodetector have a high degree of freedom in designing its detection wavelength range and conduction electrons running at high speed, thereby enabling high-speed responses.

A plurality of multilayer structures may be arranged along a plane perpendicular to a stacking direction of the first layer, semiconductor structure layer, and second layer. Arranging a plurality of multilayer structures increases a light-receiving area, thereby enhancing the photosensitivity of the photodetector.

The first layer may be formed integrally over a plurality of multilayer structures. This stabilizes the arrangement of multilayer structures and enables the first layer to function as a common electrode.

On the other hand, the semiconductor structure layer may be formed into separate pieces for a plurality of multilayer structures, respectively, or continuously over a plurality of multilayer structures. In either case, the electric field of incident light can be enhanced, so as to provide a photodetector having high photosensitivity. Therefore, the semiconductor structure layer may choose any of the structures for the convenience of the method for manufacturing the photodetector and the like.

The photodetector of the present invention may further comprise first and second electrode pad parts for taking out the electron excited by the plasmon resonance, a plurality of multilayer structures may include first and second multilayer structures having the respective second layers with widths different from each other along at least predetermined direction in an interface between the semiconductor structure layer and the second layer, the first layer may be electrically connected to the first electrode pad part, and the second layers of the first and second multilayer structures may be electrically connected to the common second electrode pad part. Since this photodetector includes first and second multilayer structures having the respective second layers with widths different from each other along at least predetermined direction in an interface between the semiconductor structure layer and the second layer, surface plasmons are excited by light components in the respective bands corresponding to these widths, and the electrons excited by the plasmon resonance are taken out as one output from the common second electrode pad part. Therefore, this photodetector can detect light having a wide wavelength band with high photosensitivity.

The photodetector of the present invention may further comprise a first electrode pad part and plurality of second electrode pad parts for taking out the electron excited by the plasmon resonance, a plurality of multilayer structures may include first and second multilayer structures having the respective second layers with widths different from each other along at least predetermined direction in an interface between the semiconductor structure layer and the second layer, the first layer may be electrically connected to the first electrode pad part, and the second layers of the first and second multilayer structures may be electrically connected to the respective second electrode pad parts different from each other. Since this photodetector includes first and second multilayer structures having the respective second layers with widths different from each other along at least predetermined direction in an interface between the semiconductor structure layer and the second layer, surface plasmons are excited by light components in the respective bands corresponding to these widths, and the electrons excited by the plasmon resonance are taken out as separate outputs from the respective second electrode pad parts different from each other. Therefore, this photodetector can detect light having a wide wavelength band as spectrally separated wavelength band components with high photosensitivity.

The present invention can provide a photodetector having high photosensitivity while using a semiconductor structure which can utilize light absorption of quantum intersubband transitions.

BRIEF DESCRIPTION OF THE DRAWINGS

FIG. 3 is a set of partial sectional views illustrating steps of manufacturing the photodetector of FIG. 1;

FIG. 4 is a set of partial sectional views illustrating steps of manufacturing the photodetector of FIG. 1;

FIG. 5 is a set of partial sectional views illustrating steps of manufacturing the photodetector of FIG. 1;

DESCRIPTION OF THE PREFERRED EMBODIMENTS

Figure 1:
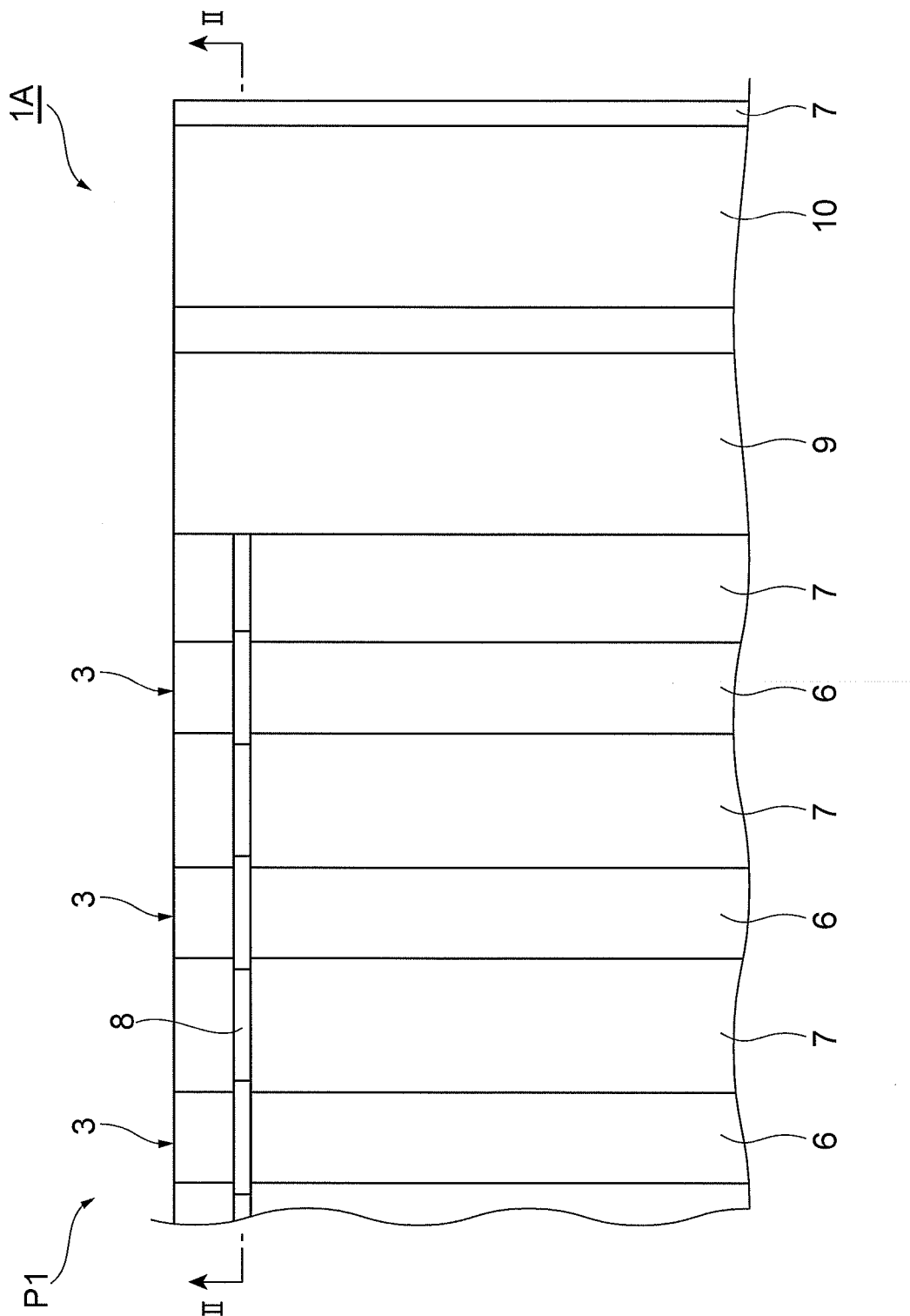
FIG. 1 is a partial plan view of the photodetector in accordance with a first embodiment of the present invention.

In the following, preferred embodiments of the present invention will be explained with reference to the drawings. The same or equivalent parts in the drawings will be referred to with the same signs, while omitting their overlapping descriptions.

First Embodiment

Figure 2:
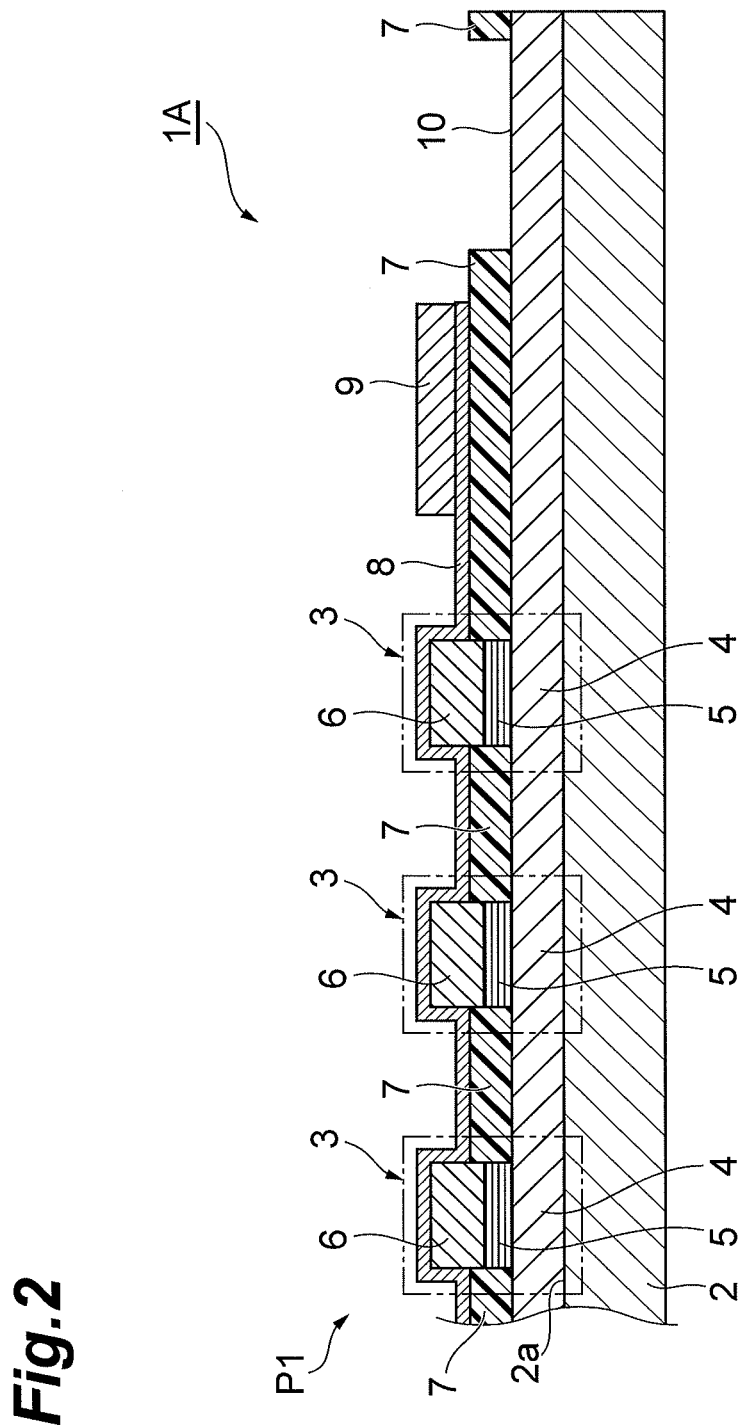
FIG. 2 is a sectional view taken along the line II-II of FIG. 1.

As illustrated in FIGS. 1 and 2, a photodetector 1A comprises a substrate 2 made of a semiconductor such as InP, GaAs, or Si or SiO$_2$ (glass) and a plurality of multilayer structures 3 arranged on a principal surface 2a thereof.

Each multilayer structure 3 comprises a first metal layer (first layer) 4 constituted by first metal such as Au, Ag, or Al; a semiconductor structure layer 5 mounted on the first metal layer 4 and adapted to excite electrons in response to light incident thereon and its resulting plasmon resonance; and a second metal layer (second layer) 6 mounted on the semiconductor structure layer 5 and constituted by second metal such as Au, Ag, or Al. The plurality of multilayer structures 3 are arranged such that a periodic pattern P1 is formed like stripes along a plane perpendicular to the stacking direction of the first metal layer 4, semiconductor structure layer 5, and second metal layer 6 on the substrate 2 in a planar view. That is, the periodic pattern P1 is patterned one-dimensionally along a plane perpendicular to the stacking direction of the multilayer structures 3.

The semiconductor structure layer 5 has a quantum intersubband level designed in conformity to the wavelength of light to be detected and specifically includes a QWIP or QCD structure in which semiconductor layers of InGaAs and InAlAs or InP having respective energy bandgaps different from each other are alternately stacked with a thickness of several nm each.

The first metal layer 4 is integrally formed over the plurality of semiconductor structures 3. The first metal layer 4 also functions as a common electrode for taking out the electrons excited by the plasmon resonance.

Insulating layers 7 constituted by $SiO_2$, $Si_3N_4$, or the like are formed in regions which are free of the second metal layers 6 and semiconductor 5 structure layers (i.e., a region between the multilayer structures 3) on the integrally formed first metal layer 4. A wiring electrode 8 made of Au, Ti/Au, or the like extends so as to crawl on the exposed surfaces of the second metal layers 6 in the multilayer structures 3 and the respective exposed surfaces of the insulating layers 7 and electrically connect the second metal layers 6 to each other.

A lead electrode (second electrode pad part) 9 for taking out the electrons excited by the plasmon resonance is electrically connected to one end of the wiring electrode 8. In a region free of the periodic pattern P1, the photodetector 1A has a part exposing the first metal layer 4 from a portion of the insulating layer 7 in a planar view as a grounding electrode part (first electrode pad part) 10. The grounding electrode part 10 is constructed such as to be able to apply a bias voltage between the lead electrode 9 and the first metal layer 4 serving as a ground potential when necessary.

A method of manufacturing the photodetector 1A will now be explained. As illustrated in FIG. 3(a), on a semiconductor temporary substrate 101 made of InP or the like, a semiconductor quantum subband structure 105 is formed by epitaxially growing InGaAs and InAlAs or InP in alternate layers each having a thickness of about several nm by using a method such as MBE or MOCVD. The semiconductor quantum subband structure 105 grown here has been designed beforehand so as to become optimal for the aimed wavelength and the like. Then, a first metal film 104 is formed on the semiconductor quantum subband structure 105 by vacuum deposition, sputtering, or the like.

Next, as illustrated in FIG. 3(b), the substrate 2 made of a semiconductor such as InP, GaAs, or Si or $SiO_2$ (glass) for keeping the mechanical strength of the photodetector 1A is bonded to the surface of the first metal film 104. Then, as illustrated in FIG. 4(a), the semiconductor temporary substrate 101 is removed by polishing, chemical etching, and the like. For keeping the semiconductor quantum subband structure 105 at that time, an etching stop layer or sacrificial layer may be formed beforehand by a known technique.

Figure 6:
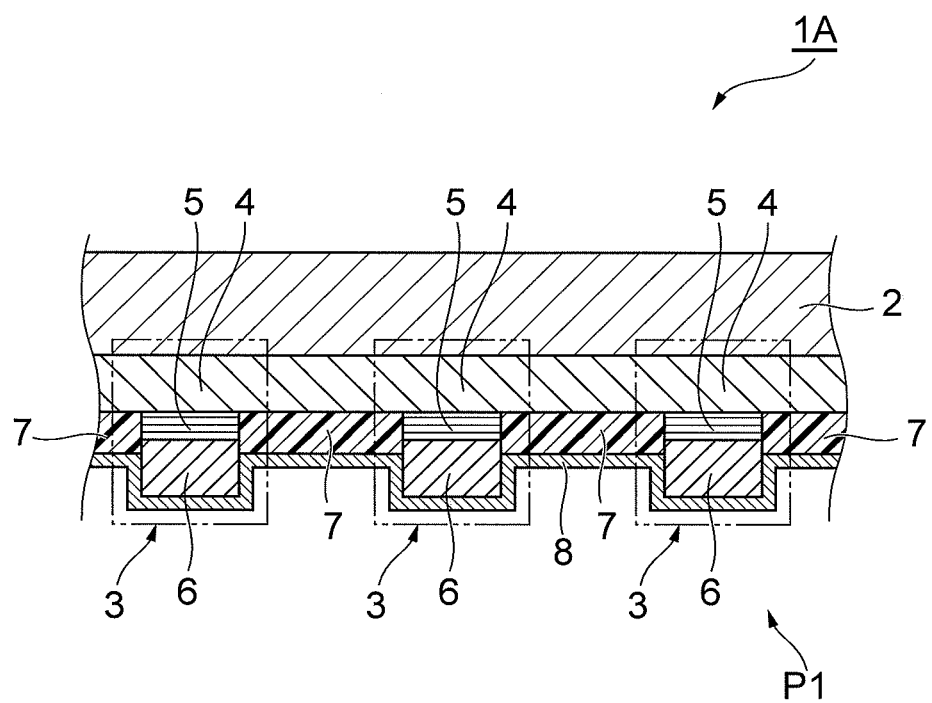
FIG. 6 is a partial sectional view illustrating steps of manufacturing the photodetector of FIG. 1.

Subsequently, as illustrated in FIG. 4(b), a second metal film 106 is formed on the surface of the quantum subband structure 105 exposed by removing the semiconductor temporary substrate 101, and then, as illustrated in FIG. 5(a), the second metal film 106 and quantum subband structure 105 are partly etched by lithography, so as to form a plurality of multilayer structures 3, each comprising the first metal layer 4, semiconductor structure layer 5, and second metal layer 6, and the stripe-shaped periodic pattern P1. Thereafter, as illustrated in FIG. 5(b), insulating films 7 are formed in regions between the multilayer structures 3 adjacent to each other, and then, as illustrated in FIG. 6, the wiring electrode 8 and lead electrode 9 are formed, whereby the photodetector 1A is obtained.

The operation principle and effects of the photodetector 1A will now be explained. In the photodetector 1A, each of the multilayer structures 3 acts as a cavity which causes surface plasmon resonance. When light polarized in the width direction of the cavity (that is also the one-dimensional direction in which the stripes in the periodic pattern P1 are arranged in a row in FIG. 1 in this embodiment) is incident thereon, surface plasmons are excited in the multilayer structure 3. The excited surface plasmons generate standing waves within the multilayer structure 3, thereby enhancing the electric field. The surface plasmons resonate within the cavity, so that the multilayer structure 3 acts as an optical antenna, whereby light incident on the periphery of the multilayer structure 3 is drawn into the cavity, thus generating an electric field component in the stacking direction. This electric field component excites electrons in the semiconductor structure layer 5, while thus excited electrons are collected into the lead electrode 9 through the wiring electrode 8 and issued as a current to an external circuit, so as to yield photosensitivity. Therefore, this photodetector 1A has high photosensitivity as a photodetector using a semiconductor structure which can utilize light absorption of quantum intersubband transitions.

Typically, a photodetector employing a QWIP or QCD structure in which semiconductor layers having respective energy bandgaps different from each other are stacked alternately as a semiconductor structure layer has no photosensitivity with respect to light having no electric field component in its stacking direction (planar waves incident thereon in the stacking direction of the semiconductor structure layer). In the photodetector 1A of this embodiment, by contrast, the plasmon resonance generates standing waves, thereby enhancing the electric field and producing an electric field component (electric field) in the stacking direction which is not inherent in the incident light. As a result, a very large electric field component occurs in the stacking direction, whereby the photodetector 1A can also detect light having no electric field component in the stacking direction before being incident thereon.

In the photodetector 1A, each of the multilayer structures 3 individually acts as a cavity which causes plasmon resonance as in the foregoing. The wavelength range of the light detected thereby is determined by the form, structure, and the like of the multilayer structure 3. Since a plurality of multilayer structures 3 are arranged along a plane perpendicular to their stacking direction in the photodetector 1A, its light-receiving area which enables light detection is large, so that the photosensitivity of the photodetector is high.

Results of a simulation concerning an electric field enhancing effect according to plasmon resonance will now be illustrated. In the case where the semiconductor structure layer 5 in the photodetector 1A is constituted by a multilayer structure of InGaAs and InAlAs, the intensity of the electric field component in the stacking direction occurring within the semiconductor structural layer 5 is calculated by an FDTD (Finite-Difference Time-Domain) simulation method.

Figure 7:
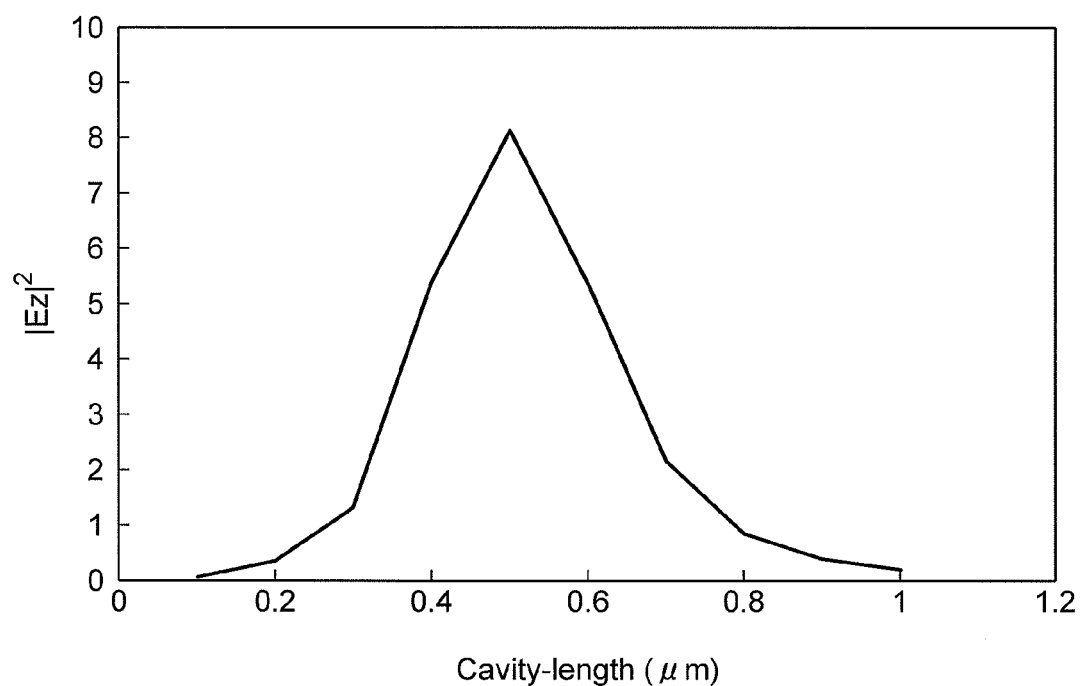
FIG. 7 is a graph illustrating results of a simulation concerning an electric field enhancing effect by the photodetector of FIG. 1.

As parameters, the total thickness of the multilayer structure of the semiconductor structure layer 5 was about 50 nm, and the period of the periodic pattern was 1 μm. Au was set as the metal for the first metal layer 4 and second metal layer 6, and the wavelength of incident light was 5 μm. As a result of the simulation with a variety of stripe widths of the second metal layer 6 and semiconductor structure layer 5, it is seen that, as illustrated in FIG. 7, the electric field intensity ($|E_z|^2$) (ordinate) exhibits the maximum value when the stripe width of the second metal layer 6 and semiconductor structure layer 5 (abscissa) is 0.5 μm, so that the factorial of its electric field intensity, i.e., the magnitude of energy, has reached 30 times or more that of the incident light by plasmon resonance.

The fact that the electric field enhancement effect becomes high when the stripe width of the second metal layer 6 and semiconductor structure layer 5 is 0.5 μm can be explained by using the following expressions (1) to (3):

$$L = \lambda_p/2 \quad (1)$$

$$\lambda_p = \lambda_0/n_{\mathit{eff}} \quad (2)$$

$$n_{\mathit{eff}} = n\sqrt{1+2\delta/T} \quad (3)$$

where L is the width of the second metal layer 6 along a predetermined direction (a direction perpendicular to the longitudinal direction of the multilayer structure 3 here) in the interface between the semiconductor structure layer 5 and second metal layer 6 (i.e., the width of the cavity causing plasmon resonance), $\lambda_p$ is the plasmon wavelength, $\lambda_0$ is the vacuum wavelength of the incident light, $n_{\mathit{eff}}$ is the effective refractive index of the semiconductor quantum subband structure, n is the refractive index of the semiconductor quantum subband structure, δ is the skin depth of the metal, and T is the thickness of the semiconductor quantum subband structure. Substituting actual values, i.e., $\lambda_0=5$ μm, n=3.5, δ=25 nm, and T=50 nm, into these expressions yields L of about 0.5 μm, which coincides with the simulation results. These expressions mean that the multilayer structure 3 having the length L in a direction perpendicular to the stacking direction acts as a resonator of surface plasmons having the wavelength $\lambda_p$ excited by the incident light, whereby only light having a specific wavelength causes a phenomenon of enhancing the electric field. That is, the wavelength of surface plasmon standing waves excited thereby is twice the resonator length or an integer submultiple of twice the resonator length. While the length L of the multilayer structure 3 having a cubic form is directly substituted into the expressions in this example, an effective resonator length is required to be employed for applying the above-mentioned expressions (1) to (3) when the multilayer structure 3 is formed and arranged not like a stripe but an island as in other embodiments which will be explained later.

Figure 8:
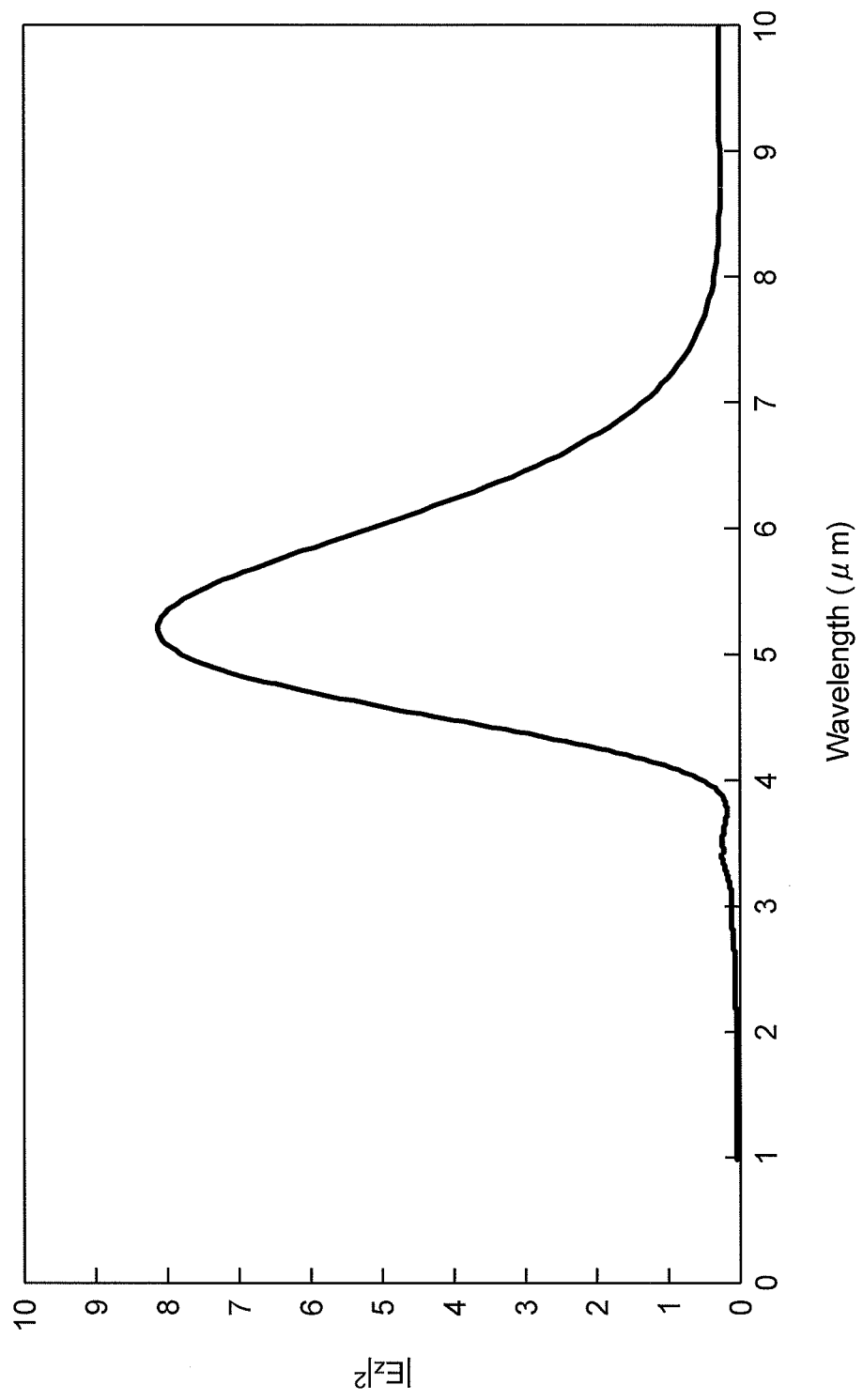
FIG. 8 is a graph illustrating results of a simulation concerning generation of an electric field vector in the stacking direction.

Another simulation is performed concerning the photodetector 1A for its capability of causing surface plasmon resonance and generating an electric field vector in the stacking direction. FIG. 8 illustrates results of the simulation. These are the results of calculating the incident light wavelength dependence of the intensity ($|E_z|^2$) of the electric field vector in the stacking direction concerning a 0.5-μm-width-striped resonator in which a dielectric body having a refractive index of 3.4, which is the same as the refractive index of a quantum well structure at a wavelength of 5 μm, is held between Au members. It is seen from FIG. 8 that an electric field vector intensity ($|E_z|^2$) which is 10 times or more that of the total electric field intensity of the incident light can be obtained at the resonance wavelength of 5 μm.

Figure 9:
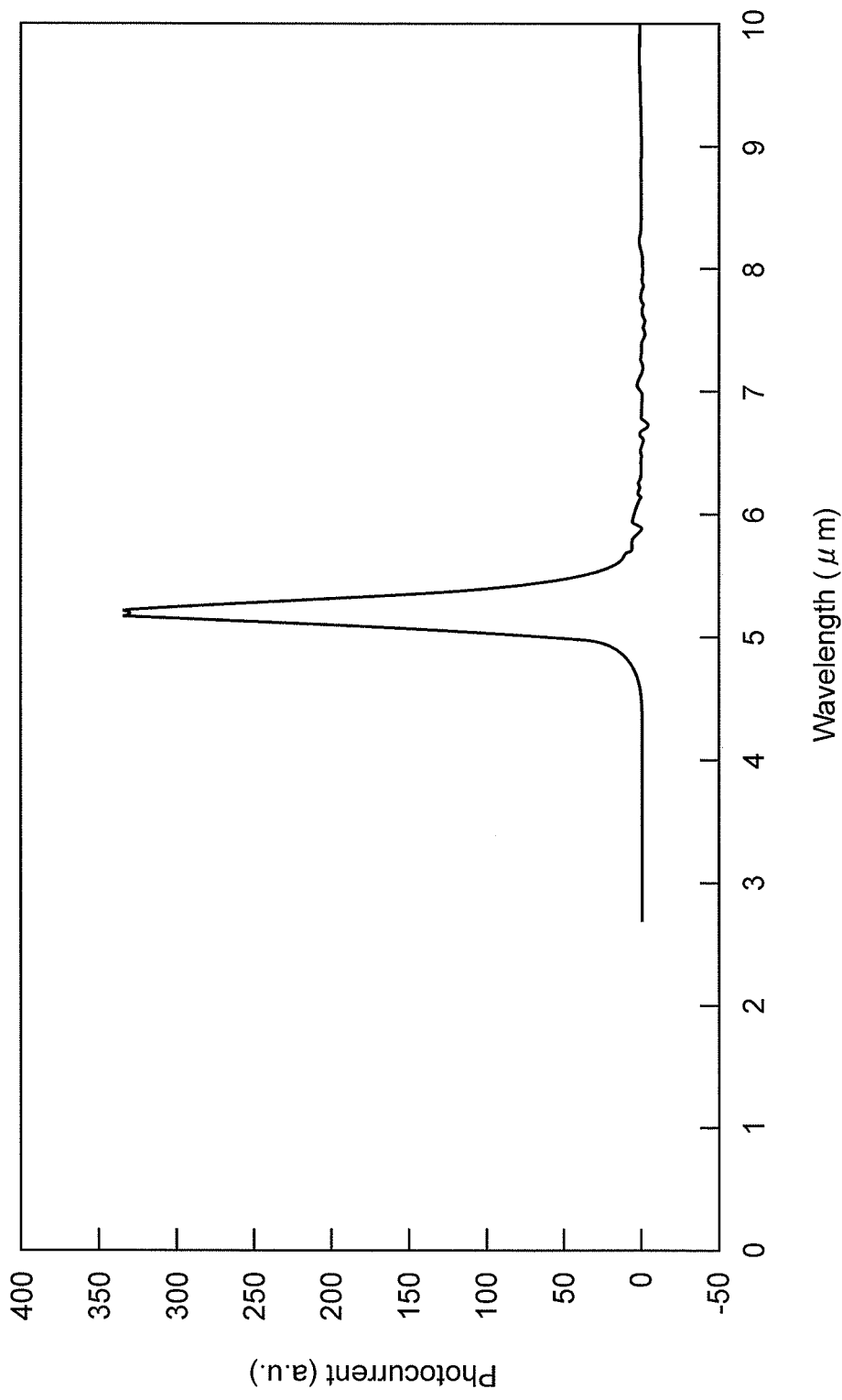
FIG. 9 is a graph illustrating the actual spectral sensitivity of the simulated multilayer structure in FIG. 8.

The multilayer structure subjected to the simulation was actually produced, and its spectral sensitivity was measured at a temperature of 77 K. The graph of FIG. 9 illustrates the results. The abscissa and ordinate indicate the wavelength of incident light and the resulting photocurrent (a. u.), respectively. It is seen from this graph that photosensitivity is obtained with respect to the light incident in the stacking direction. Here, QCD was employed as the semiconductor structure layer.

Figure 10:
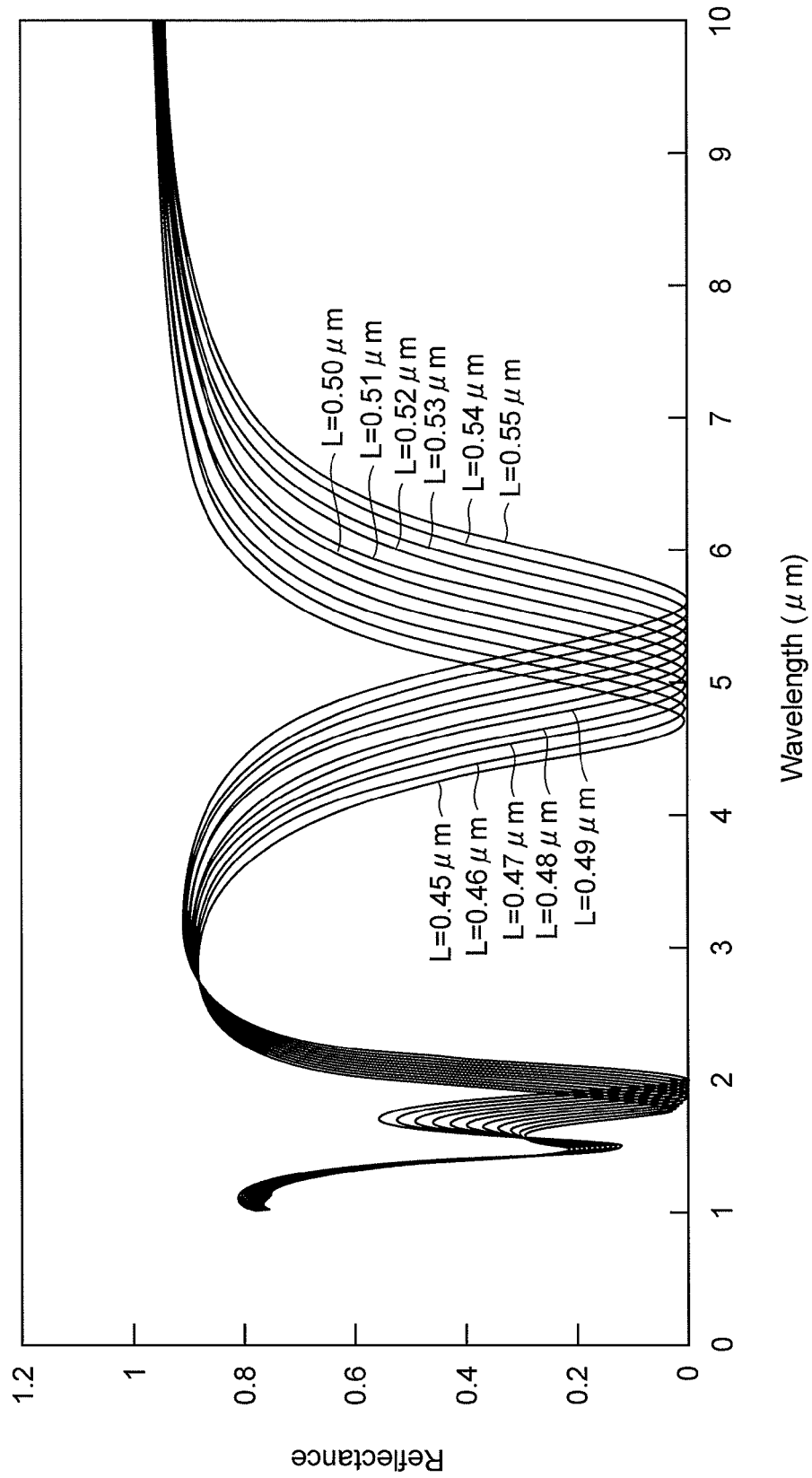
FIG. 10 is a graph illustrating results of a simulation concerning reflection spectra when changing the resonator length.

Also, while changing the resonator length from 0.45 μm to 0.55 μm, reflection spectra of a plasmon resonator were simulated. The graph of FIG. 10 illustrates the results. It is seen from this graph that the light absorbed by the plasmon resonator yields a reflectance of substantially 0 at the resonance wavelength and that the peak of absorbed wavelengths varies when the resonator length is changed.

Figure 11:
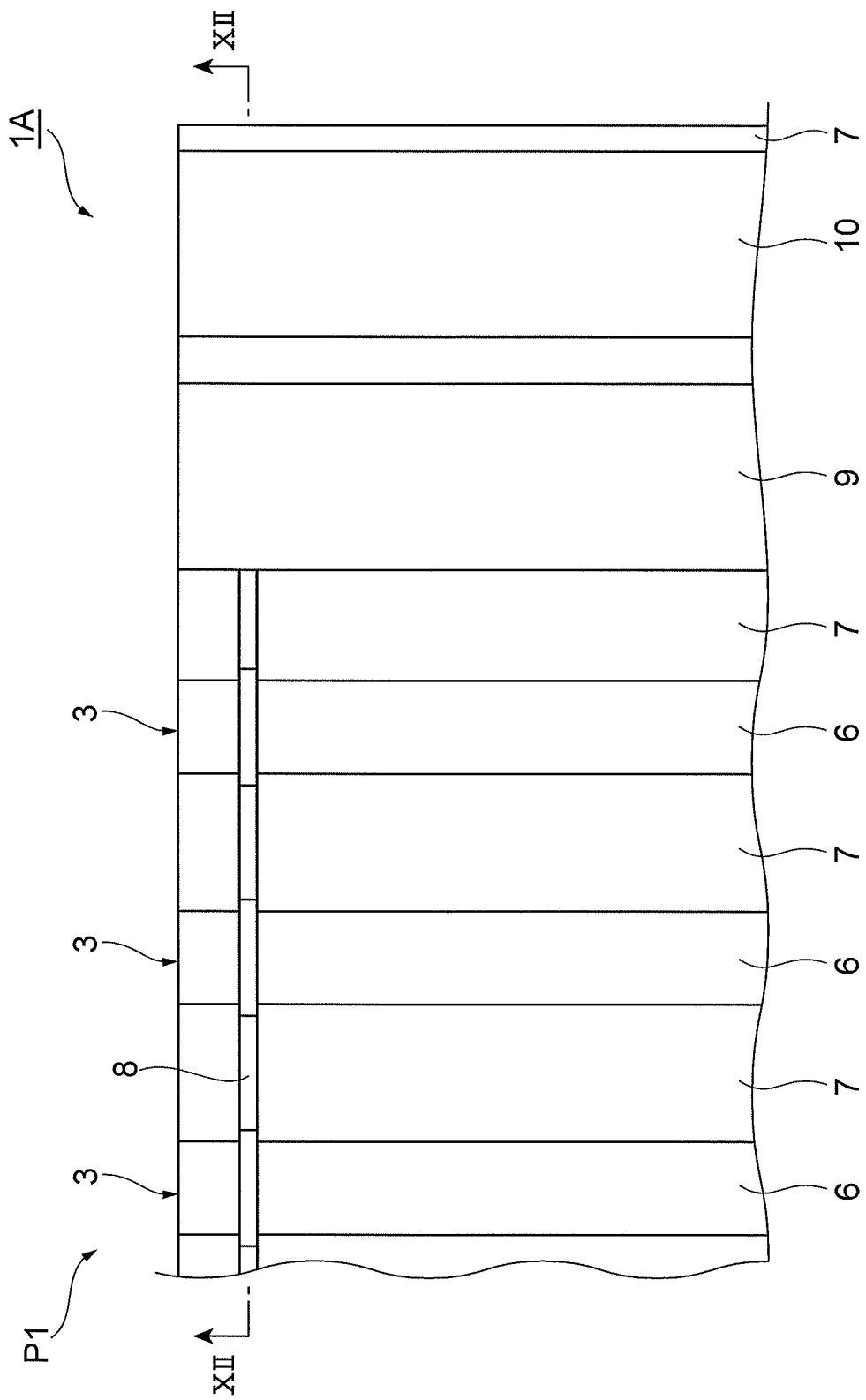
FIG. 11 is a partial plan view of a modified example of the photodetector in accordance with the first embodiment of the present invention.
Figure 12:
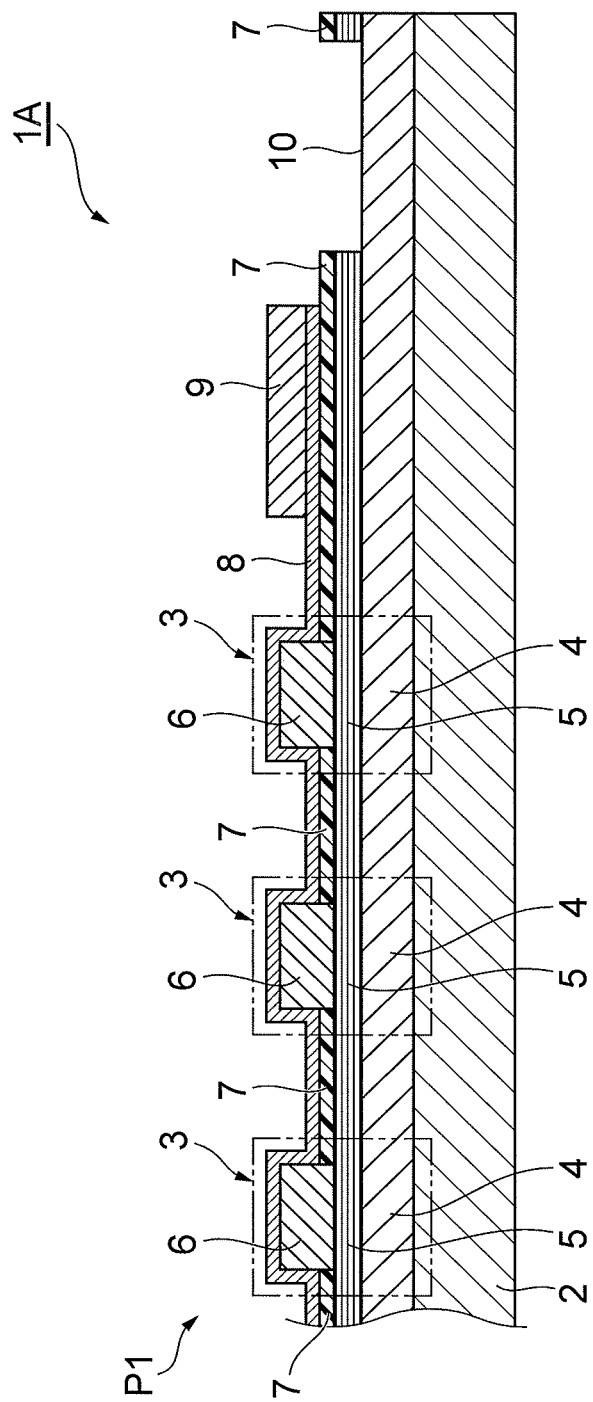
FIG. 12 is a sectional view taken along the line XII-XII of FIG. 11.

While the photodetector 1A of the first embodiment illustrates a mode in which the semiconductor structure layer 5 is formed into separate pieces for a plurality of multilayer structures 3, respectively, the semiconductor structure 5 may be formed continuously over a plurality of multilayer structures 3 as illustrated in FIGS. 11 and 12. It has been verified from results of simulations that effects on a par with those of the photodetector 1A of the first embodiment are also obtained when the semiconductor structure layer is continuously formed as such.

Second Embodiment

Figure 13:
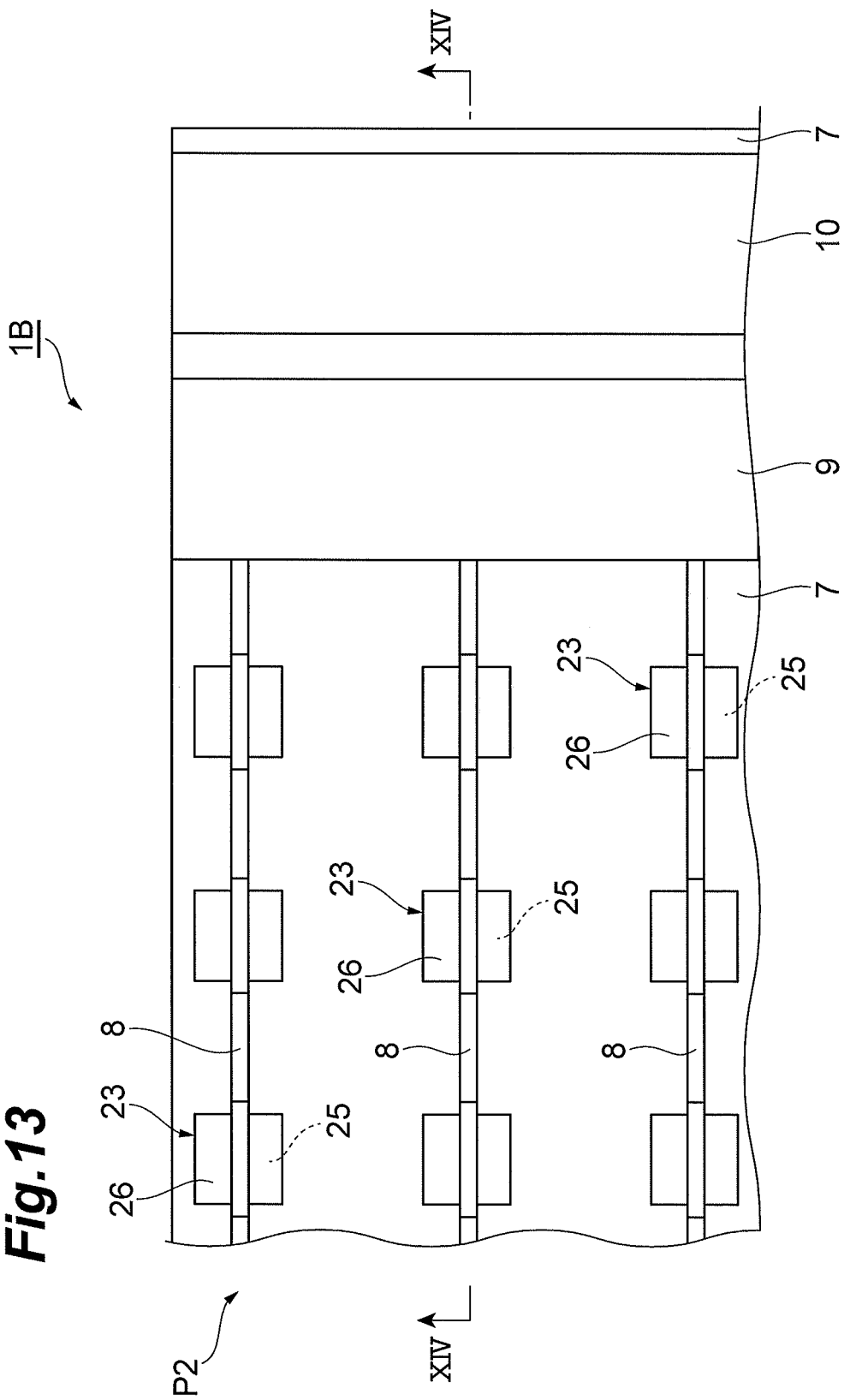
FIG. 13 is a partial plan view of the photodetector in accordance with a second embodiment of the present invention.
Figure 14:
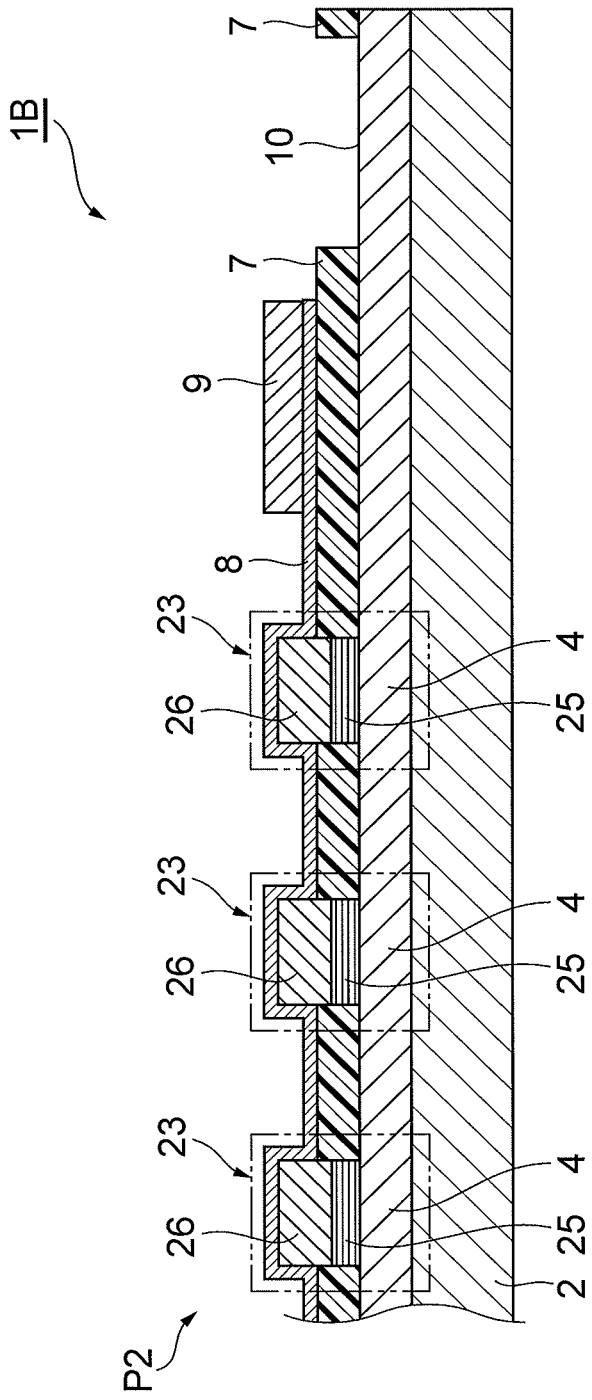
FIG. 14 is a sectional view taken along the line XIV-XIV of FIG. 13.

Another mode of the photodetector will be explained as the second embodiment of the present invention. As illustrated in FIGS. 13 and 14, the photodetector 1B of the second embodiment differs from the photodetector 1A of the first embodiment in the form and arrangement of multilayer structures in a planar view.

In the photodetector 1B, a plurality of multilayer structures 23, each having a second metal layer 26 and a semiconductor structure layer 25 which are square in a planar view, are arranged like islands in a square lattice, so as to construct a periodic pattern P2. That is, the periodic pattern P2 is patterned two-dimensionally along a plane perpendicular to the stacking direction of the multilayer structures 23.

While the photodetector 1A of the first embodiment has the multilayer structure 3 capable of acting as a cavity for causing surface plasmon resonance in only one direction (the direction in which stripe-shaped periodic pattern P1 arranged in a row) and thus exhibits photosensitivity only for light polarized in this direction (light having an electric field component in this direction), the photodetector 1B of the second embodiment has the second metal layer 26 and semiconductor structure layer 25 that are square in a planar view, whereby its multilayer structure 23 can act as a cavity causing surface plasmon resonance in at least directions connecting opposing sides of the square (two directions). That is, the photodetector 1B is advantageous in that it has photosensitivity in two directions orthogonal to each other on the plane of the square.

Third Embodiment

Figure 15:
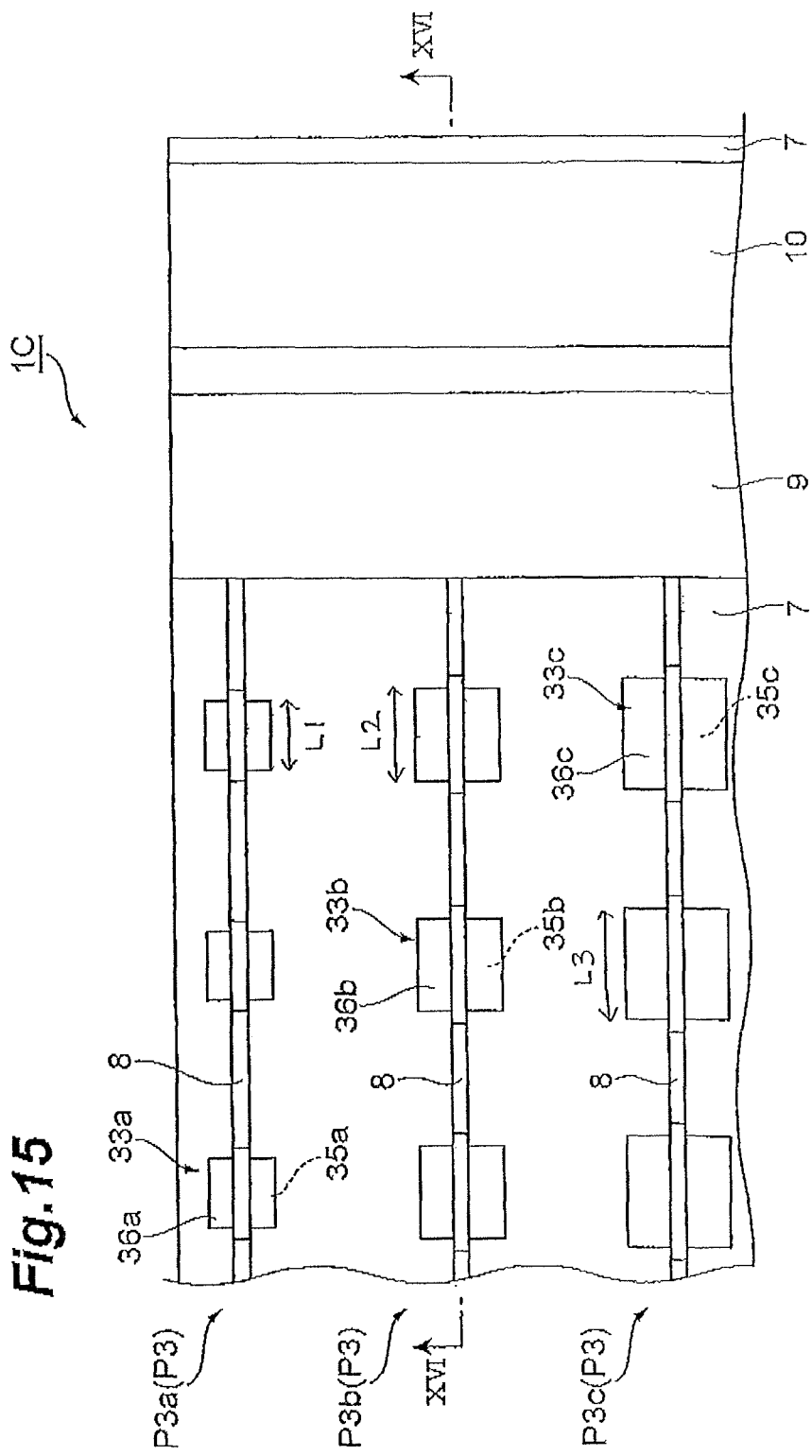
FIG. 15 is a partial plan view of the photodetector in accordance with a third embodiment of the present invention.
Figure 16:
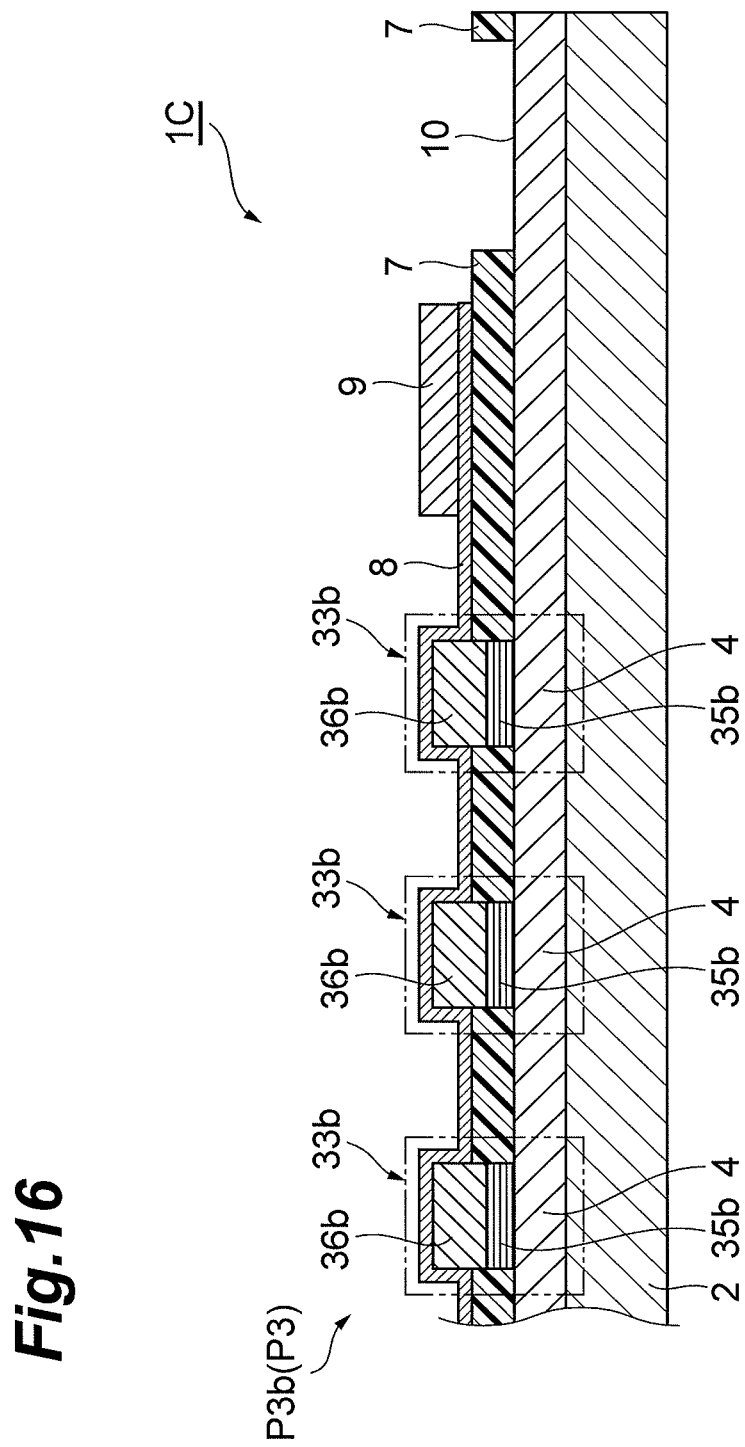
FIG. 16 is a sectional view taken along the line XVI-XVI of FIG. 15.

Another mode of the photodetector will be explained as the third embodiment of the present invention. As illustrated in FIGS. 15 and 16, the photodetector 1C of the third embodiment differs from the photodetector 1B of the second embodiment in that it includes a plurality of sizes of multilayer structures.

A periodic pattern P3 in the photodetector 1C includes a plurality of periodic pattern parts P3a, P3b, P3c having different sizes of second metal layers 36a, 36b, 36c and semiconductor structure layers 35a, 35b, 35c. That is, as illustrated in FIG. 15, multilayer structures 33a, 33b, 33c form the first periodic pattern part P3a, second periodic pattern part P3b, third periodic pattern part P3c which are distinguished from one another by different sizes of the second metal layers 36a, 36b, 36c and semiconductor structure layers 35a, 35b, 35c, while their respective periodic pattern parts P3a, P3b, P3c are each patterned one-dimensionally along a plane perpendicular to the stacking direction of the multilayer structures 33a, 33b, 33c. Respective wiring electrodes 8 are wired for the periodic pattern parts P3a, P3b, P3c and electrically connected to a common lead electrode 9.

As can be seen from FIG. 7 in the first embodiment, the electric field enhancement effect depends on the widths of the second metal layers 36a, 36b, 36c and semiconductor structure layers 35a, 35b, 35c. More specifically, it depends on the width (resonator width) that can act as a cavity causing surface plasmon resonance in the widths of the second metal layers 36a, 36b, 36c in their interfaces with the semiconductor structure layers 35a, 35b, 35c. Therefore, the photodetectors 1A, 1B of the first and second embodiments, each including only one kind of multilayer structures 3, have a narrow wavelength band which exhibits high photosensitivity. By contrast, the photodetector 1C of this embodiment including a plurality of sizes of multilayer structures has a plurality of widths L1, L2, L3 adapted to act as the cavities and thus yields a wide wavelength range which exhibits high photosensitivity. That is, in the photodetector 1C of this embodiment, light having a wavelength band corresponding to widths adapted to act as the cavities causing surface plasmon resonance in the widths of the second metal layers 36a, 36b, 36c in their interfaces with the semiconductor structure layers 35a, 35b, 35c excites surface plasmons, and electrons excited by the plasmon resonance are taken out as one output from the common lead electrode 9. Therefore, this photodetector 1C can detect light having a wide wavelength band with high photosensitivity. It has theoretically been verified that, even when the multilayer structures 33a, 33b, 33c having sizes different from each other are thus formed adjacent to each other, their respective plasmon resonance effects are not hindered.

While the photodetector 1C of the third embodiment illustrates a mode in which each of the periodic pattern parts is patterned one-dimensionally, they may be patterned two-dimensionally. While the photodetector 1C of the third embodiment illustrates a mode in which the respective wiring electrodes 8 are wired for the periodic pattern parts P3a, P3b, P3c, they may traverse different periodic pattern parts.

Fourth Embodiment

Figure 17:
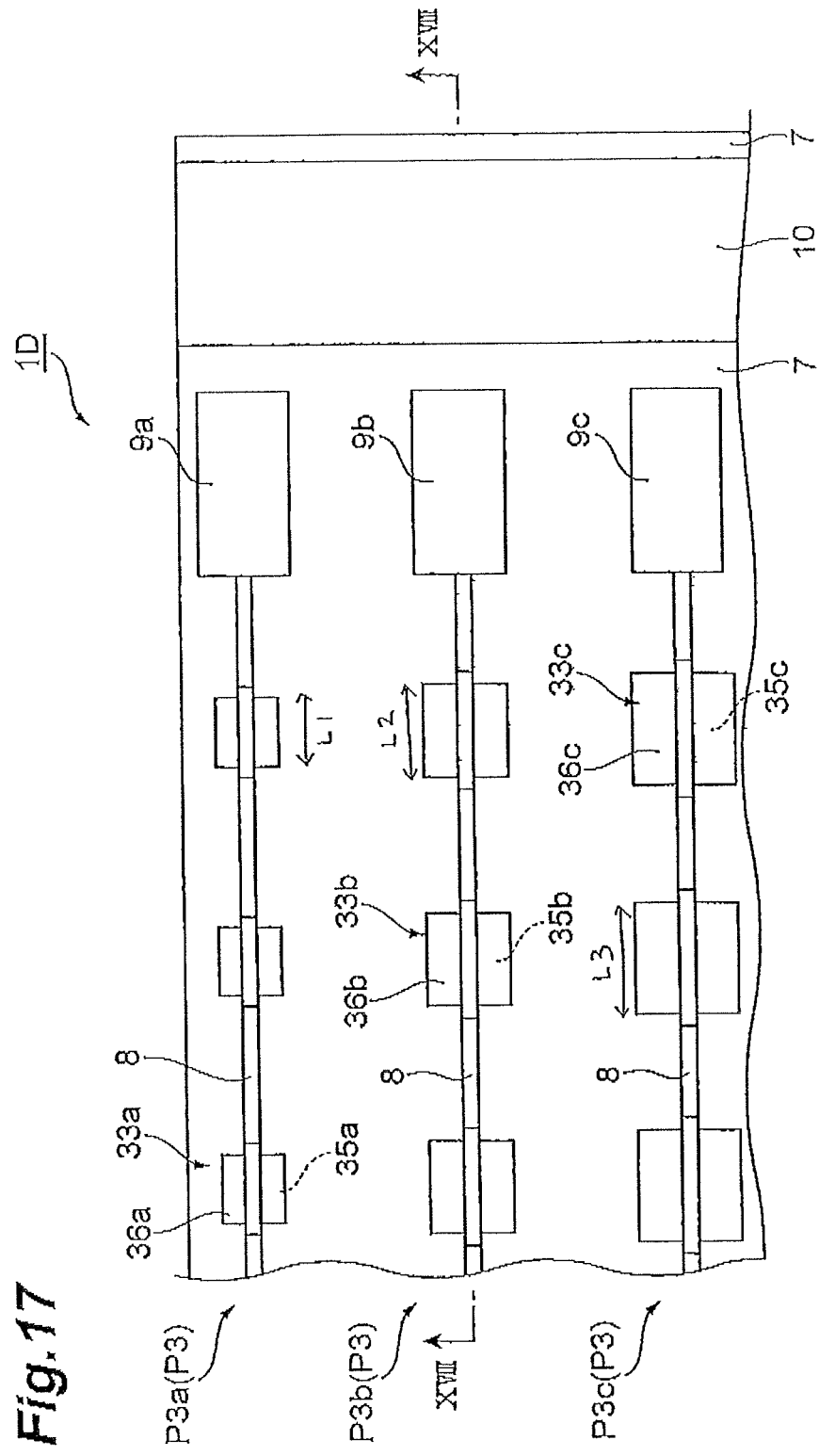
FIG. 17 is a partial plan view of the photodetector in accordance with a fourth embodiment of the present invention.
Figure 18:
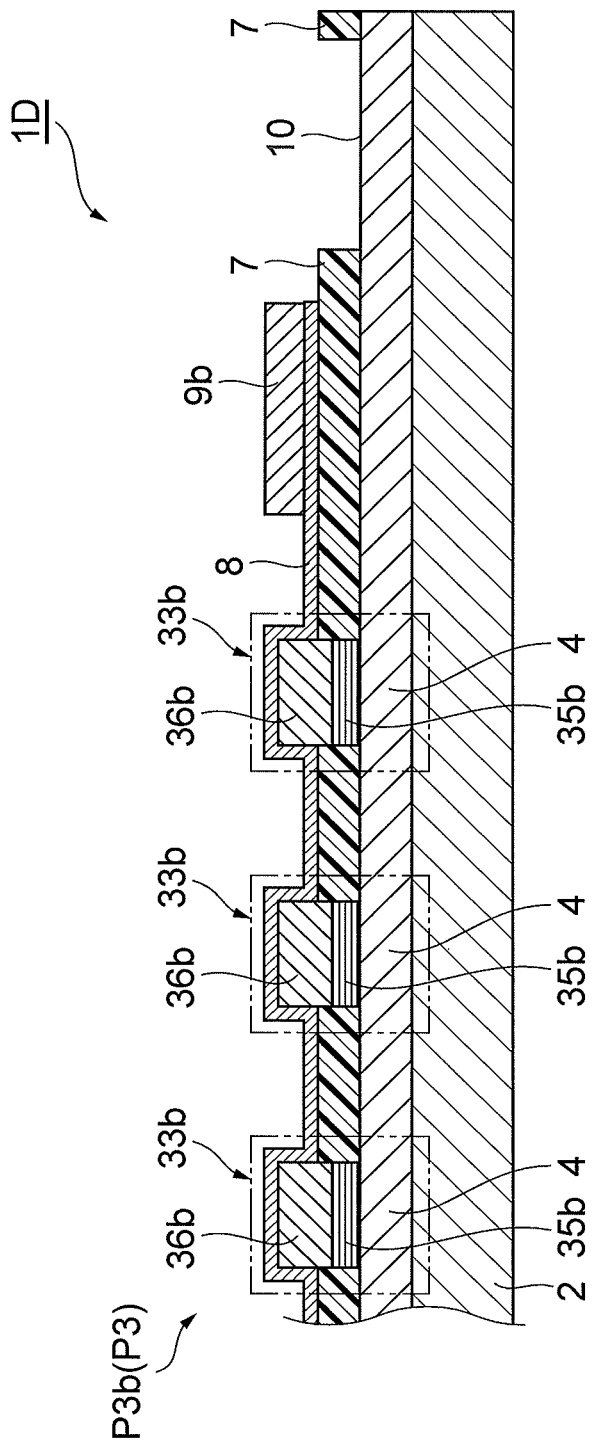
FIG. 18 is a sectional view taken along the line XVIII-XVIII of FIG. 17.

Another mode of the photodetector will be explained as the fourth embodiment of the present invention. As illustrated in FIGS. 17 and 18, the photodetector 1D of the fourth embodiment differs from the photodetector 1C of the third embodiment in that a plurality of lead electrodes are formed, so that a plurality of periodic pattern parts P3a, P3b, P3c are electrically connected to respective lead electrodes 9a, 9b, 9c which are different from each other.

In this photodetector 1D, light components having different wavelength bands are detected by the respective lead electrodes 9a, 9b, 9c, whereby light having a wide wavelength band can be detected as spectrally separated wavelength band components with high photosensitivity.

While the photodetector 1D of the fourth embodiment illustrates a mode in which each of the periodic pattern parts is patterned one-dimensionally, they may be patterned two-dimensionally.

Fifth Embodiment

Figure 19:
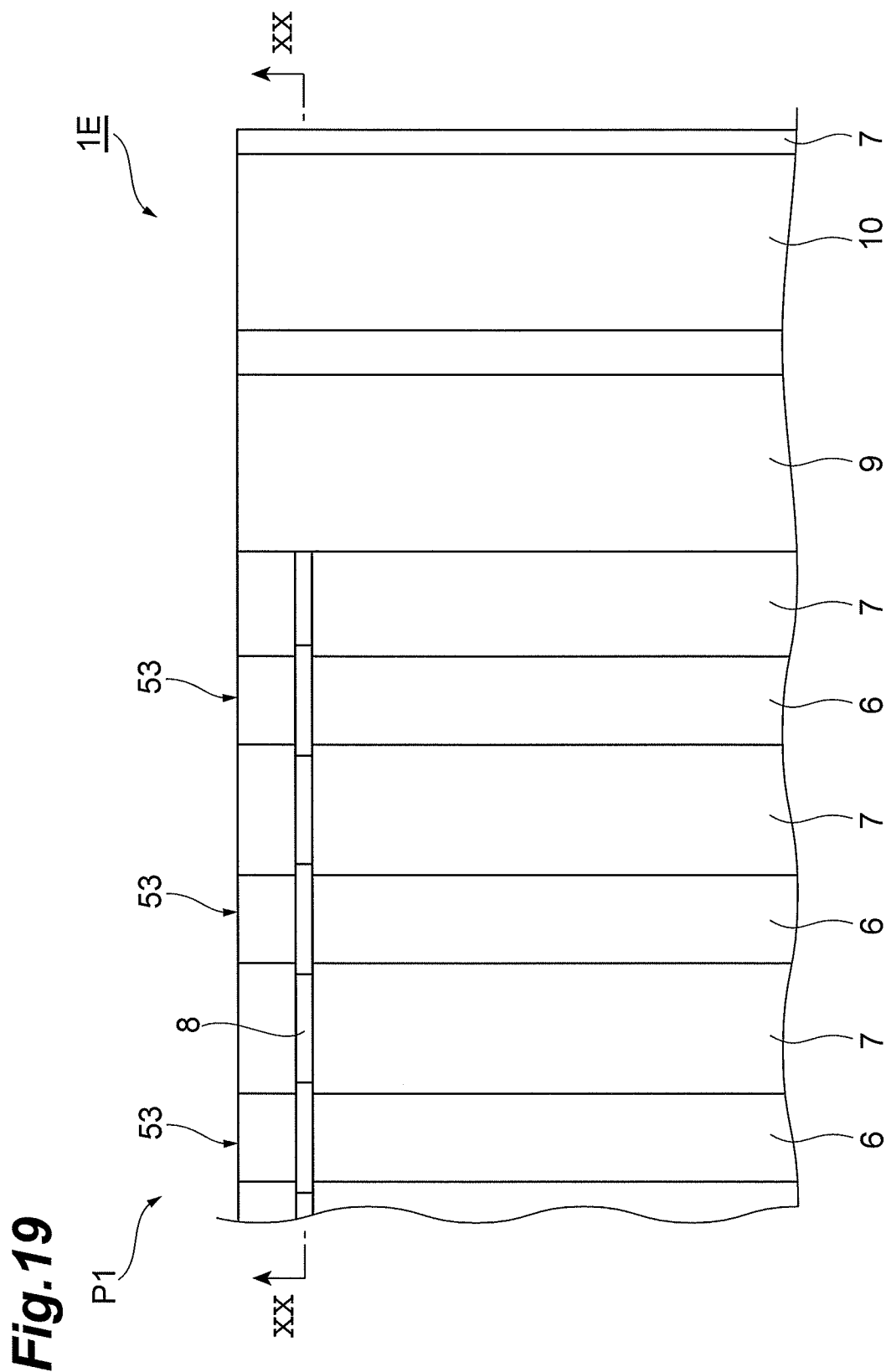
FIG. 19 is a partial plan view of the photodetector in accordance with a fifth embodiment of the present invention.
Figure 20:
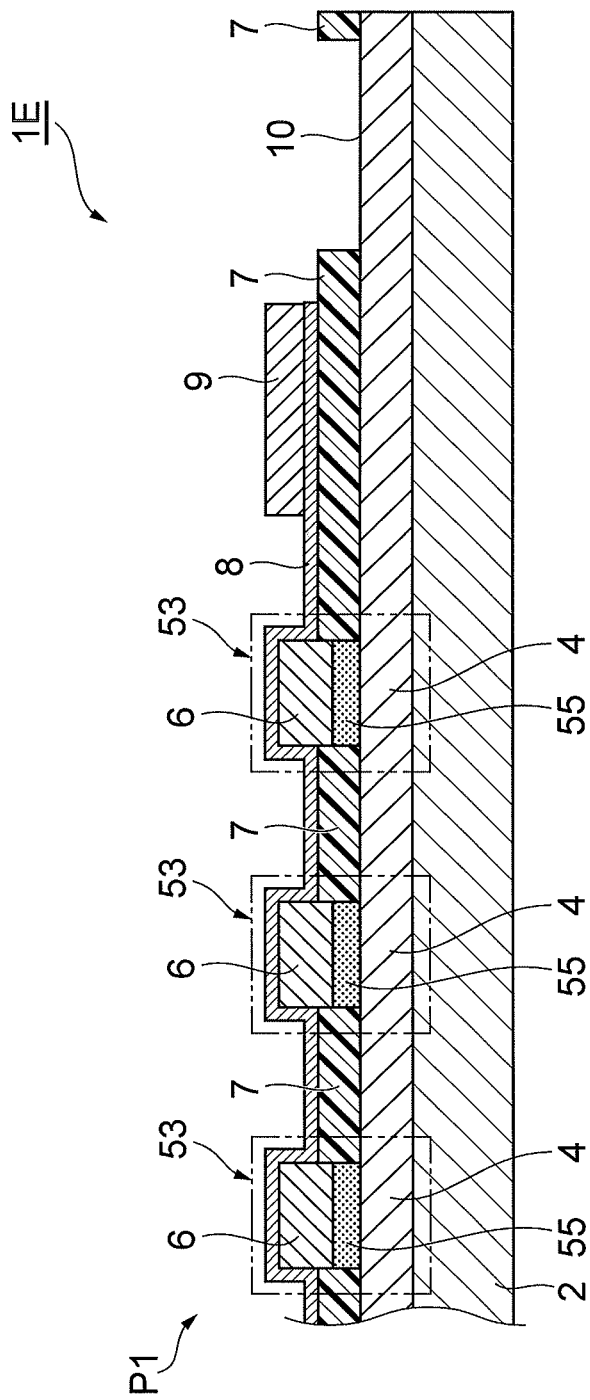
FIG. 20 is a sectional view taken along the line XX-XX of FIG. 18.

Another mode of the photodetector will be explained as the fifth embodiment of the present invention. As illustrated in FIGS. 19 and 20, the photodetector 1E of the fifth embodiment differs from the photodetector 1A of the first embodiment in that it employs a QDIP structure in place of the QWIP or QCD structure as a semiconductor structure layer 55 constituting a multilayer structure 53.

Unlike the QWIP or QCD structure, the QDIP structure has three-dimensional directions for light confinement and thus can eliminate polarization dependence, thereby being able to detect light independently of the vibration direction of the electric field of light. Though the QDIP has a drawback in that it has intrinsically low photosensitivity due to its structure, the photodetector 1E of this embodiment enhances the electric field within the multilayer structure 53 by plasmon resonance and thus attains high photosensitivity.

Sixth Embodiment

Figure 21:
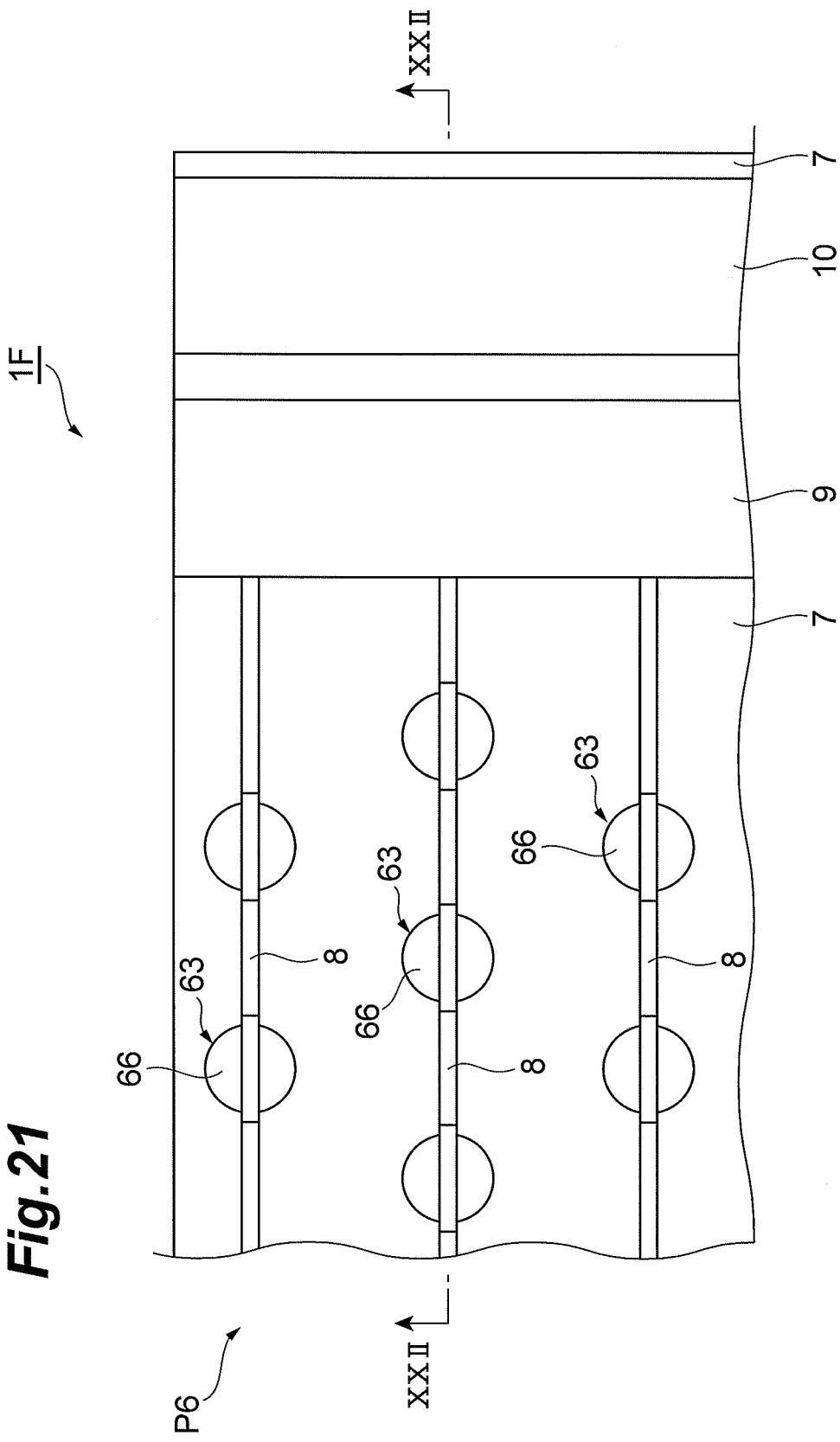
FIG. 21 is a partial plan view of the photodetector in accordance with a sixth embodiment of the present invention.
Figure 22:
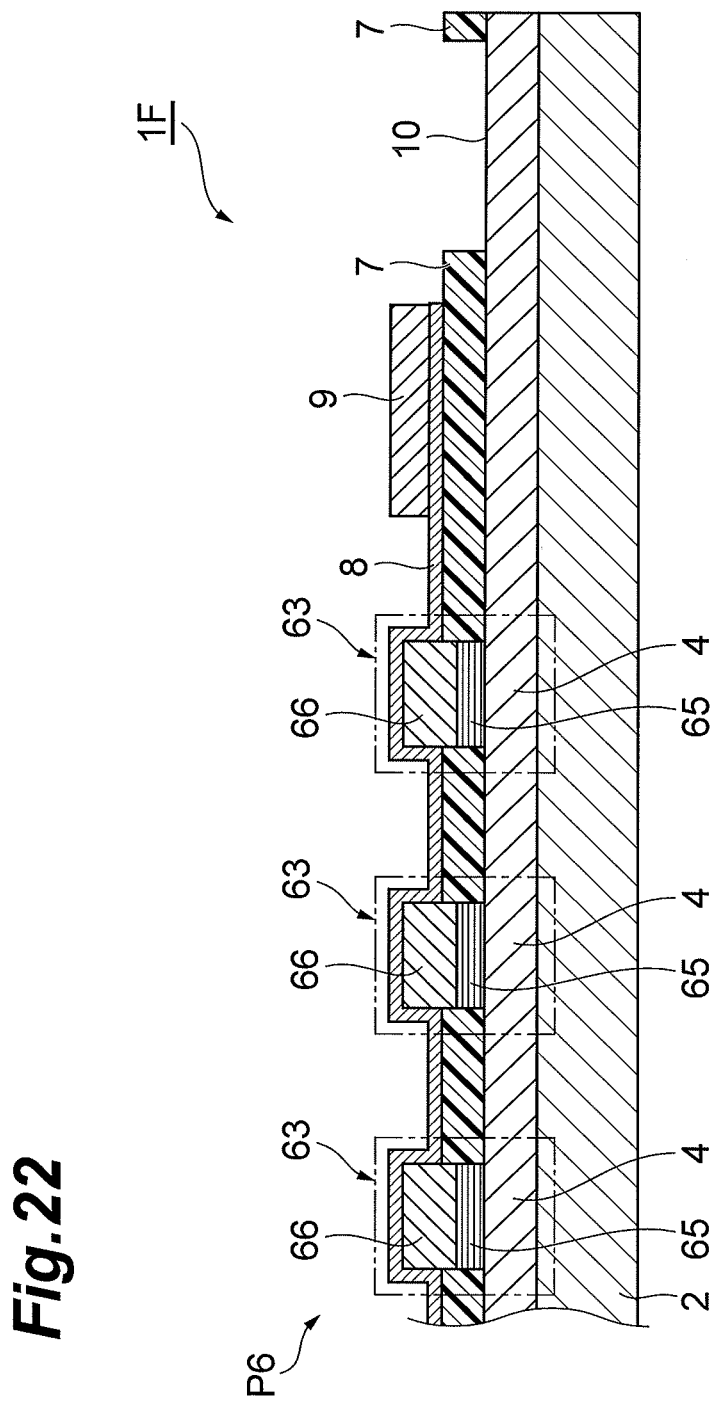
FIG. 22 is a sectional view taken along the line XXII-XXII of FIG. 19.

Another mode of the photodetector will be explained as the sixth embodiment of the present invention. As illustrated in FIGS. 21 and 22, the photodetector 1F of the sixth embodiment differs from the photodetector 1B of the second embodiment in the form and arrangement of multilayer structures in a planar view.

That is, in the photodetector 1F, a plurality of multilayer structures 63, each having a second metal layer 66 and a semiconductor structure layer 65 which are circular in a planar view, are arranged like islands in a triangular lattice, so as to construct a periodic pattern P6.

While the photodetector 1B of the second embodiment exhibits high photosensitivity only when the incident light has a specific polarization direction (i.e., when the electric field has a specific vibration direction), the photosensitivity in the photodetector 1F of this embodiment is less dependent on the polarization direction of the incident light.

Seventh Embodiment

Figure 23:
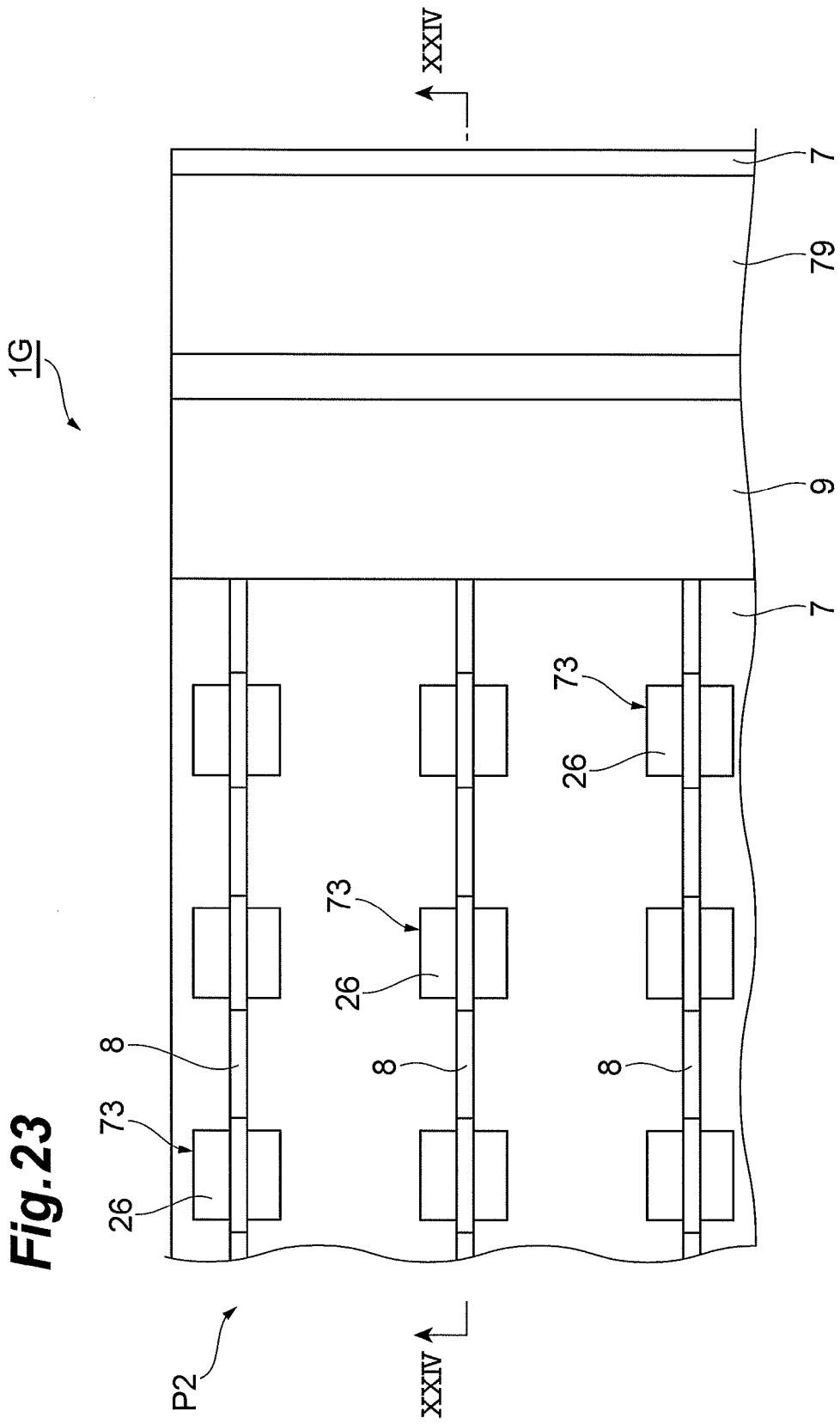
FIG. 23 is a partial plan view of the photodetector in accordance with a seventh embodiment of the present invention.
Figure 24:
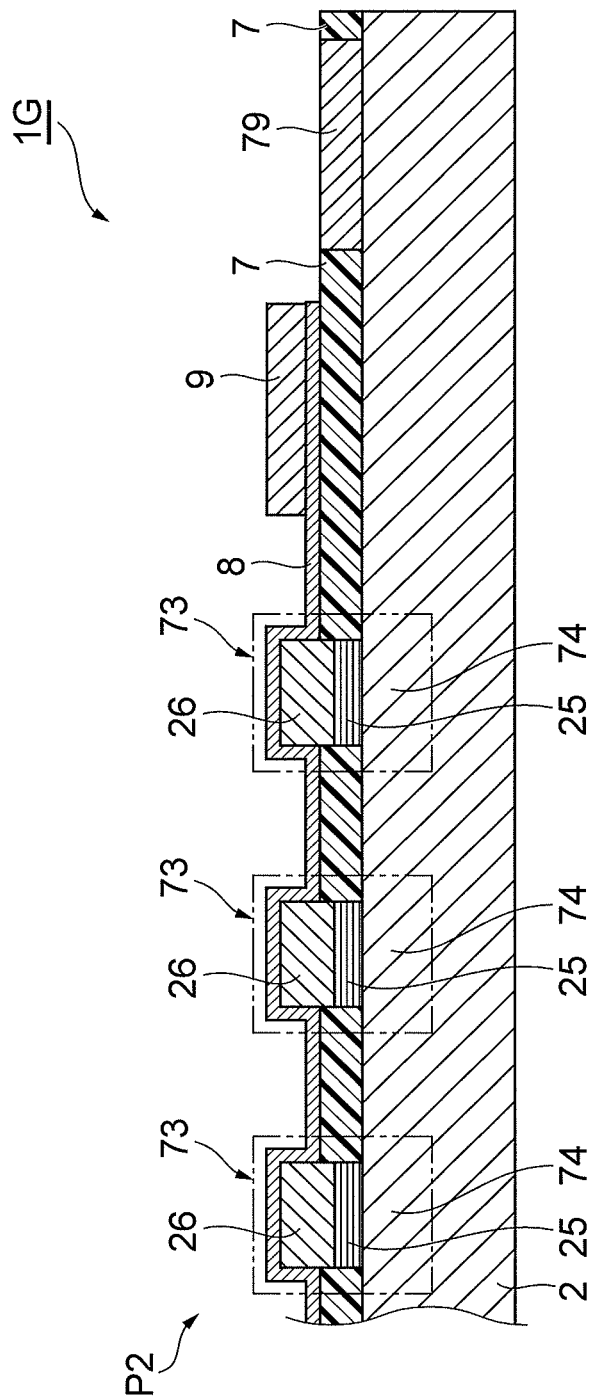
FIG. 24 is a sectional view taken along the line XXIV-XXIV of FIG. 23.

Another mode of the photodetector will be explained as the seventh embodiment of the present invention. As illustrated in FIGS. 23 and 24, the photodetector 1G of the seventh embodiment differs from the photodetector 1B of the second embodiment in that it comprises a semiconductor layer 74 highly doped with impurities in place of the substrate 2 and first metal layer 4. Also, a lead electrode 79 is disposed in the part used as the grounding electrode part 10 in the photodetector 1B of the second embodiment.

The semiconductor layer 74 is constituted by a semiconductor such as InP which is highly doped with impurities such as Si and Zn. Semiconductors highly doped with impurities have been known to yield negative dielectric constants with respect to mid-infrared rays as with metals (see, for example, D. Li, C. Z. Ning, "All-semiconductor active plasmonic system in mid-infrared wavelengths", Opt. Express, 19, 14594 (2011)). Therefore, incident mid-infrared rays may combine with surface plasmons in multilayer structures 73, thereby causing plasmon resonance. This can yield photosensitivity for incident light as in the first embodiment. The photodetector 1G can be manufactured easily, since the step of bonding a substrate as illustrated in FIG. 3(b) is unnecessary.

In the photodetector 1G of the seventh embodiment, a semiconductor highly doped with impurities as with the one used in the semiconductor layer 74 may be mounted on the semiconductor structure layer 25 in place of the second metal such as Au, Ag, or Al. As mentioned above, a semiconductor layer highly doped with impurities can be used in place of the second metal in a wavelength band where the semiconductor highly doped with impurities exhibits a negative dielectric constant. In this case, the photodetector 1G can be manufactured more easily.

Eighth Embodiment

Figure 25:
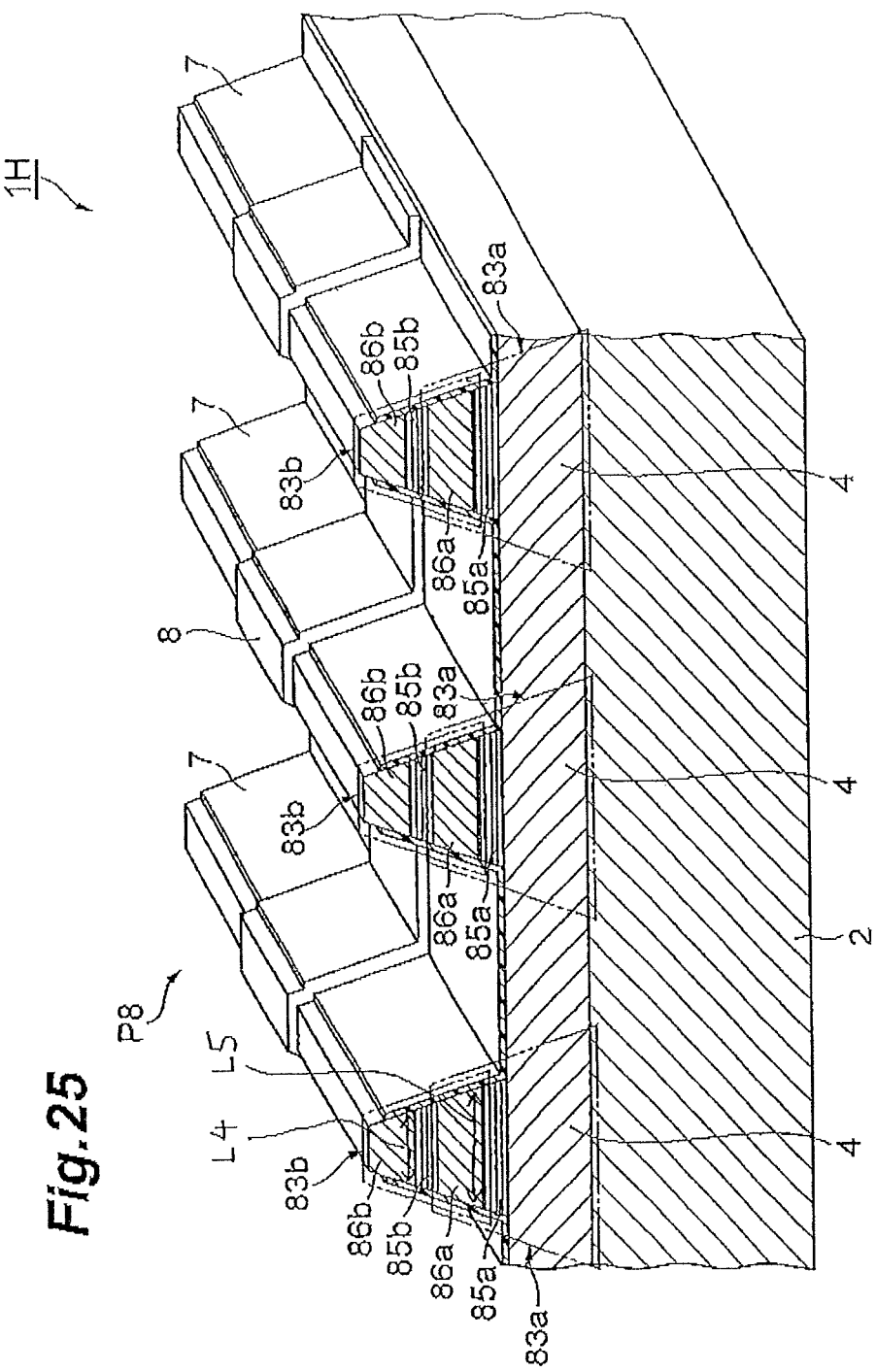
FIG. 25 is a perspective sectional view of the photodetector in accordance with an eighth embodiment of the present invention.

Another mode of the photodetector will be explained as the eighth embodiment of the present invention. As illustrated in FIG. 25, the photodetector 1H of the eighth embodiment differs from the photodetector 1A of the first embodiment in that it comprises a plurality of first or second metal layers and a plurality of semiconductor structure layers and that the multilayer structure has a trapezoidal form in a cross-sectional view.

In the photodetector 1H, a first metal layer 4, a semiconductor structure layer 85a, and a second metal layer 86a which are stacked on a substrate 2 in this order from the substrate 2 side form a multilayer structure 83a. The second metal layer 86a, a semiconductor structure layer 85b, and a second metal layer 86b form another multilayer structure 83b. Here, the second metal layer 86a is used in common between the multilayer structures 83a, 83b and functions as a first metal layer in the configuration of the multilayer structure 83b.

A plurality of multilayer structures 83a, 83b are arranged on the substrate 2 so as to form a stripe-shaped periodic pattern P8 in a planar view along a plane perpendicular to the stacking direction of the first metal layer 4, semiconductor structure layer 85a, second metal layer 86a, semiconductor structure layer 85b, and second metal layer 86b. That is, the periodic pattern P8 is patterned one-dimensionally along a plane perpendicular to the stacking direction of the multilayer structures 83a, 83b. The first metal layer 4, semiconductor structure layer 85a, second metal layer 86a, semiconductor structure layer 85b, and second metal layer 86b gradually reduce their widths in the direction in which the stripes forming the periodic pattern P8 are arranged in a row in this order (as distanced farther from the substrate 2), whereby each of the multilayer structures 83a, 83b is trapezoidal in a cross-sectional view. The multilayer structures 83a, 83b are also formed so as to be trapezoidal in a cross-sectional view when seen as one multilayer structure. The photodetector 1H can be manufactured by the same method as with the photodetector 1A of the first embodiment.

The photodetector 1H of this embodiment also yields such electric field enhancement effect and reflectance as those illustrated in FIGS. 7 to 10. That is, the multilayer structures 83a, 83b constructed as mentioned above act independently from each other as cavities which cause surface plasmon resonance. The multilayer structures 83a, 83b have respective widths (resonator lengths) L4, L5 different from each other in the direction in which stripes forming the periodic pattern P8 are arranged in a row in FIG. 25 as mentioned above, whereby the surface plasmons resonating in the respective cavities have wavelengths different from each other. Hence, there are two kinds of incident light wavelengths which can excite the surface plasmons resonating in the respective cavities. This enables the photodetector 1H to exhibit high photosensitivity for two kinds of light having respective wavelengths different from each other.

Though the photodetector 1H of the eighth embodiment illustrates a mode in which stripe-shaped periodic patterns are arranged, multilayer structures may be patterned two-dimensionally as in the photodetector 1B of the second embodiment. Here, each of the two-dimensionally arranged multilayer structures may be circular in a planar view as in the photodetector 1F of the sixth embodiment and have a tapered cylindrical form.

In the photodetector 1H, the semiconductor highly doped with impurities used in the photodetector 1G of the seventh embodiment may be mounted on the semiconductor multilayer structure layers 85a, 85b in place of the second metal such as Au, Ag, or Al. Multilayer structures may further be layered. As the number of layers increases, the photodetector 1H exhibits photosensitivity for more kinds of incident light wavelengths.

Ninth Embodiment

Figure 26:
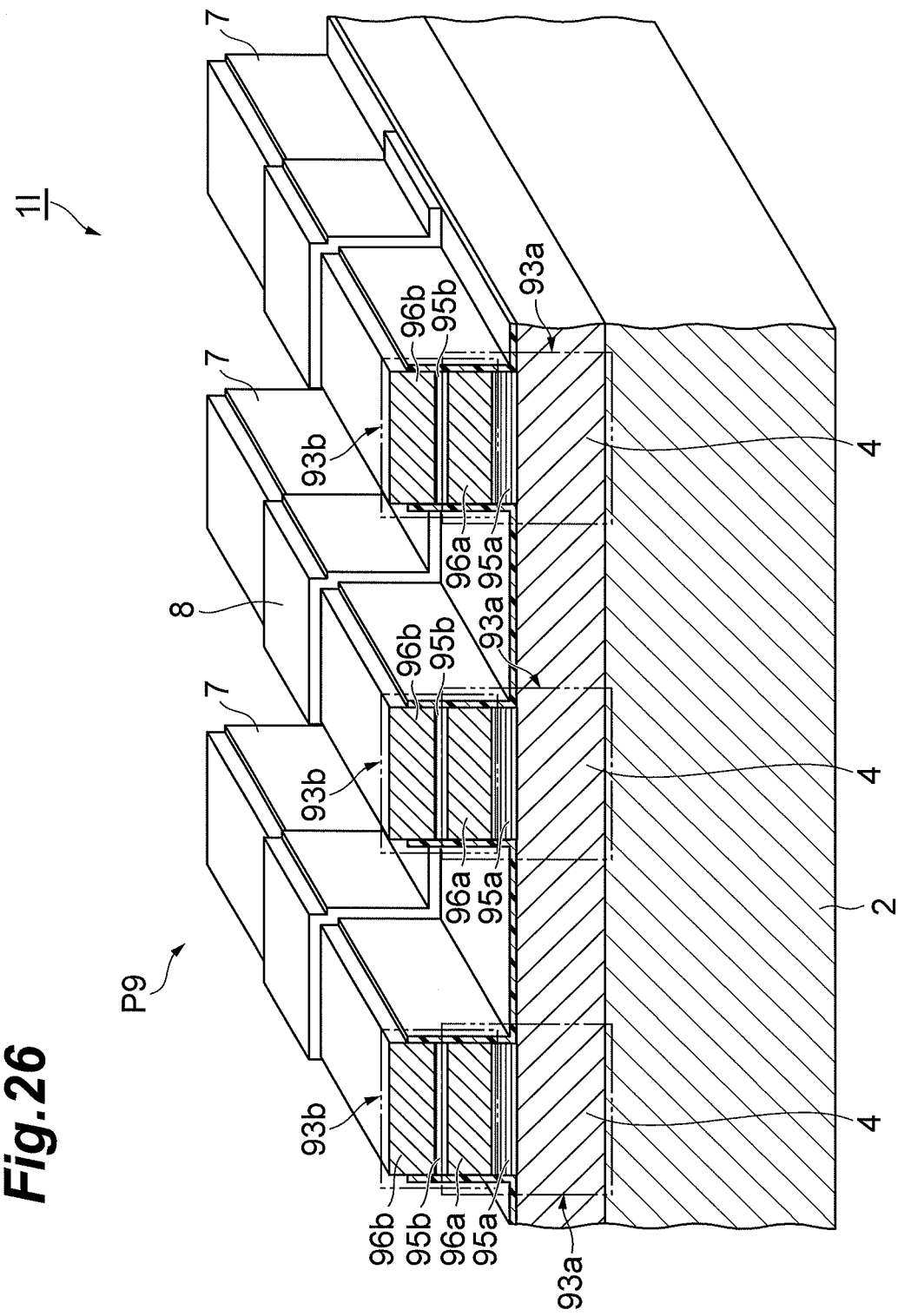
FIG. 26 is a perspective sectional view of the photodetector in accordance with a ninth embodiment of the present invention.

Another mode of the photodetector will be explained as the ninth embodiment of the present invention. As illustrated in FIG. 26, the photodetector 1I of the ninth embodiment differs from the photodetector 1H of the eighth embodiment in that multilayer structures are not trapezoidal but rectangular in a cross-sectional view and that semiconductor structure layers have respective thicknesses different from each other in the multilayer structures mounted on top of each other.

In the photodetector 1I, a first metal layer 4, a semiconductor structure layer 95a, and a second metal layer 96a which are stacked on a substrate 2 in this order from the substrate 2 side form a multilayer structure 93a. The second metal layer 96a, a semiconductor structure layer 95b, and a second metal layer 96b form another multilayer structure 93b. Here, the second metal layer 96a is used in common between the multilayer structures 93a, 93b and functions as a first metal layer in the configuration of the multilayer structure 93b.

A plurality of multilayer structures 93a, 93b are arranged on the substrate 2 so as to form a stripe-shaped periodic pattern P9 in a planar view along a plane perpendicular to the stacking direction of the first metal layer 4, semiconductor structure layer 95a, second metal layer 96a, semiconductor structure layer 95b, and second metal layer 96b. That is, the periodic pattern P9 is patterned one-dimensionally along a plane perpendicular to the stacking direction of the multilayer structures 93a, 93b. The first metal layer 4, semiconductor structure layer 95a, second metal layer 96a, semiconductor structure layer 95b, and second metal layer 96b have the same width in the direction in which the stripes forming the periodic pattern P9 are arranged in a row.

Unlike the photodetector 1H of the eighth embodiment exhibiting high photosensitivity for a plurality of kinds of incident light having respective wavelengths different from each other by making resonator lengths different from each other in cavities causing surface plasmon resonance, the photodetector 1I makes the resonator thicknesses, specifically the respective thicknesses of the semiconductor structure layers 95a, 95b, different from each other, so as to yield high photosensitivity for a plurality of kinds of incident light having respective wavelengths different from each other. That is, while there is only one kind of width (resonator length) in the direction in which the stripes forming the periodic pattern P9 are arranged in a row in each of the multilayer structures 93a, 93b in the photodetector 1I, so respective surface plasmons resonating in both cavities may be considered to have the same wavelength, the incident light wavelength adapted to excite the surface plasmons also depends on the thickness of the semiconductor structure layers 95a, 95b according to the above-mentioned expressions (1) to (3), whereby making the semiconductor structure layers 95a, 95b have respective thicknesses different from each other enables surface plasmons having a specific wavelength to be excited by incident light wavelengths different from each other. Hence, the photodetector 1I exhibits high photosensitivity for two kinds of light having respective wavelengths different from each other.

Figure 27:
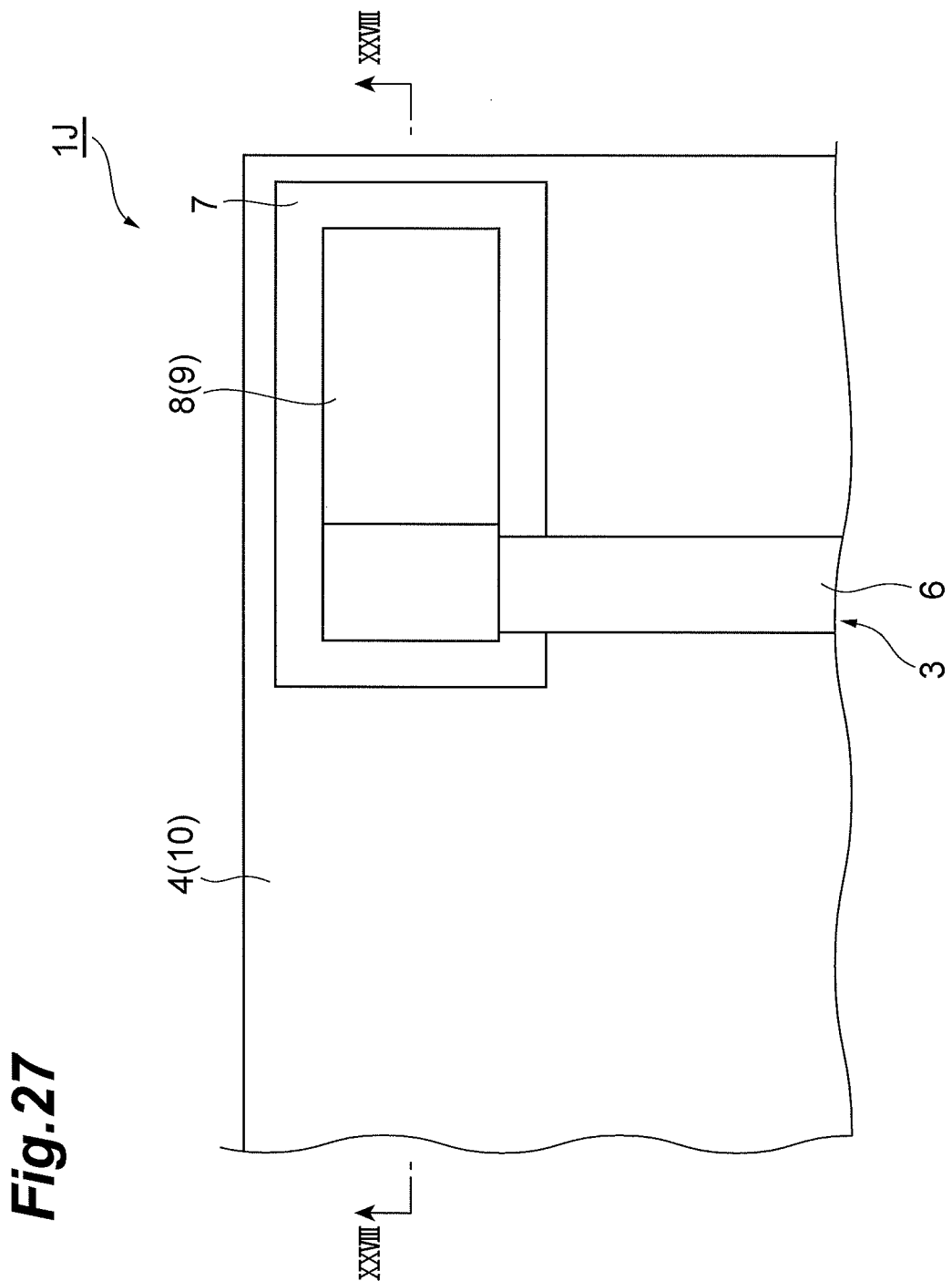
FIG. 27 is a partial plan view of the photodetector in accordance with another embodiment of the present invention.
Figure 28:
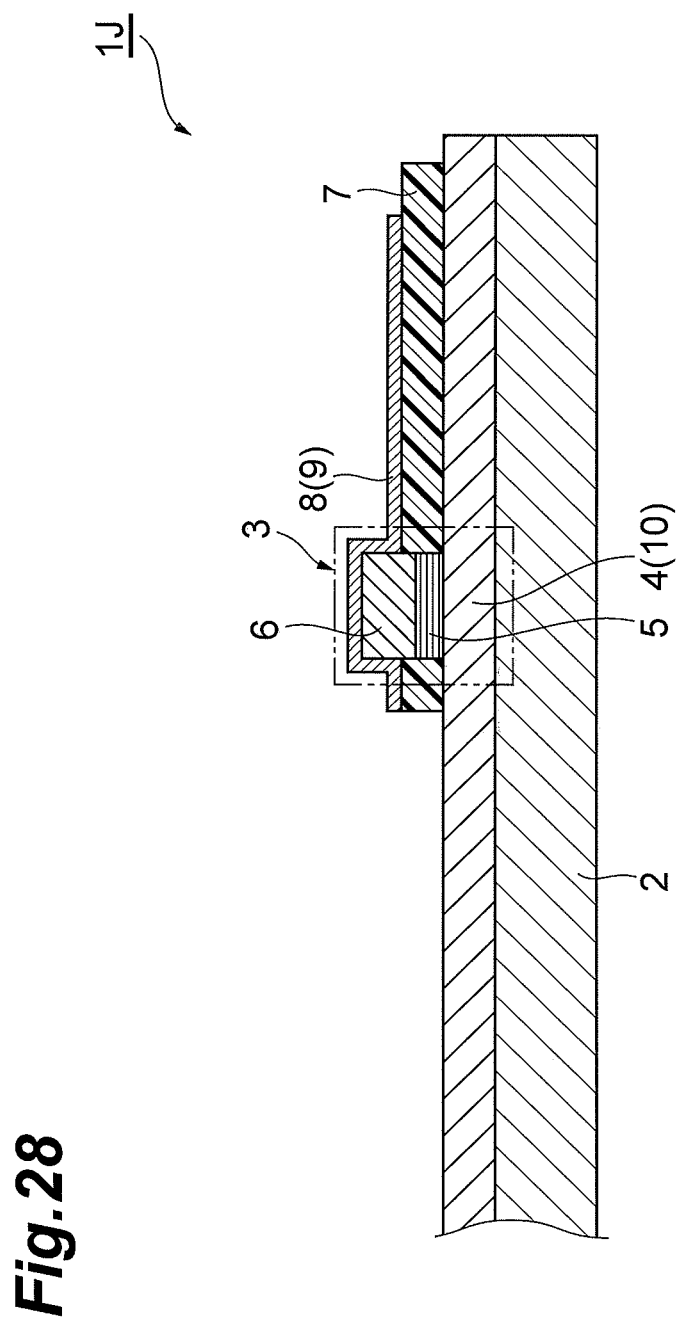
FIG. 28 is a sectional view taken along the line XXVIII-XXVIII of FIG. 27.

While preferred embodiments of the present invention are explained in the foregoing, the present invention is not limited to the above-mentioned embodiments at all. For example, while each of the above-mentioned embodiments illustrates a mode in which the multilayer structures are arranged such that a periodic pattern is formed by at least the second metal layer, the pattern may not be periodic. Since the multilayer structure by itself acts as a cavity for causing plasmon resonance, there may be one multilayer structure alone as in the photodetector 1J illustrated in FIGS. 27 and 28, for example. Here, a wiring electrode 8 also serves as a lead electrode 9, while a first metal layer 4 also serves as a grounding electrode 10. A multilayer structure 3 acts as a resonator when the width of the cavity in the multilayer structure 3, i.e., the width of a second metal layer 6 along a predetermined direction (a direction perpendicular to the longitudinal direction of the multilayer structure 3 here) in an interface between a semiconductor structure layer 5 and the second metal layer 6 is one half of the wavelength of surface plasmons to be excited or an integer multiple of one half of the wavelength of surface plasmons to be excited.

The multilayer structure may further comprise first and second contact layers formed such as to hold the semiconductor structure layer therebetween in the stacking direction of the first metal layer, semiconductor structure layer, and second metal layer. The first and second contact layers, each of which is constituted by n-type InGaAs, are layers for electrically connecting the semiconductor structure to respective electrodes in order to detect the current generated in the semiconductor structure layer. As for the thickness of the contact layers, the contact layer on the first metal layer side has a thickness of 5 to 100 nm, for example. On the other hand, the thickness of the contact layer is preferably as thin as possible, specifically 5 to 100 nm, in order for the above-mentioned effects of the electric field component to extend over the semiconductor structure layer. According to the expressions (1) to (3), the resonance wavelength varies as the film thickness (T) of the semiconductor quantum subband structure changes. It is desirable to determine the thickness of a contact layer while taking account of the fact that the film thickness changes when the contact layer is formed. Providing the first and second contact layers can lower ohmic resistance, whereby a current occurring in the semiconductor structure layer can be detected efficiently.

The modes illustrated as the first to ninth embodiments may be combined freely so as to construct a photodetector. For example, the semiconductor structure layer 55 (QDIP structure) in the photodetector 1E of the fifth embodiment may be employed in the photodetectors of the other embodiments. The semiconductor highly doped with impurities in the photodetector 1G of the seventh embodiment may also be employed in the photodetectors of the other embodiments.

Figure 29:
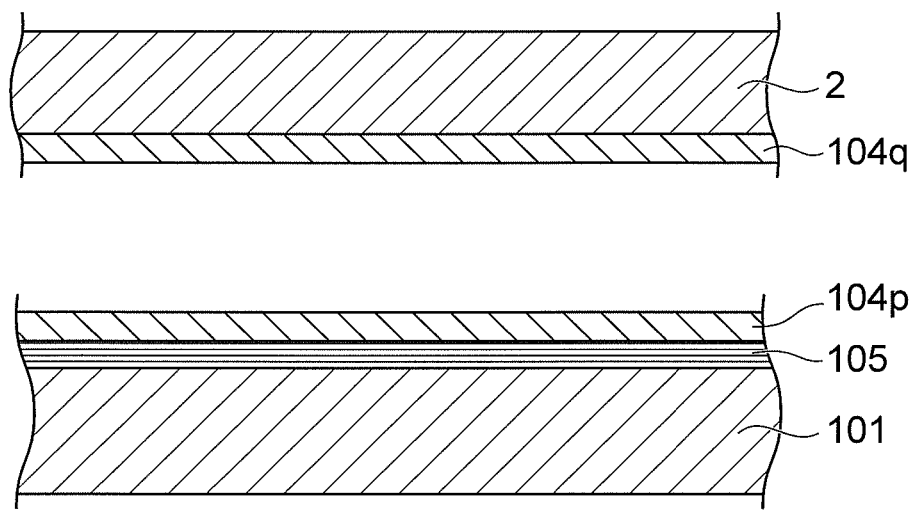
FIG. 29 is a partial sectional view illustrating a manufacturing step in another method of manufacturing the photodetector of FIG. 1.

The method of manufacturing the photodetector is not limited to the mode (FIGS. 3 to 6) illustrated in the above-mentioned embodiments. For example, the first metal film 104 may be formed by attaching two metal films to each other. That is, as illustrated in FIG. 29, on a semiconductor temporary substrate 101 made of InP or the like, a semiconductor quantum subband structure 105 is formed by epitaxially growing layers in an alternating manner by using a method such as MBE or MOCVD. Subsequently, a first metal film 104p is formed on the semiconductor quantum subband structure 105 by a method such as vacuum deposition or sputtering. On the other hand, a metal film 104q is formed on a separately prepared substrate 2. The metal films 104p, 104q are attached to each other and processed under heat/pressure, so as to be bonded together, whereby the multilayer body illustrated in FIG. 3(b) is obtained. By using subsequent steps similar to those in the manufacturing procedure illustrated in the first embodiment, the photodetector 1A can be manufactured.

Though the above-mentioned embodiments are described while assuming a state where the surface of the first metal layer 4 or semiconductor layer 74 forms a uniform plane, this surface may have projections and depressions according to the periodic configuration of the multilayer structures. The present invention is also applicable to such a form.

What is claimed is:

1. A photodetector comprising a multilayer structure having:
    a first layer consisting of a first metal;
    a semiconductor structure layer mounted on the first layer and adapted to excite an electron at the semiconductor structure layer by plasmon resonance inside of the multilayer structure; and
    a second layer mounted on the semiconductor structure layer and consisting of a second metal, the second layer overlapping the first layer so as to at least partly cover the first layer in plan view,
    wherein the semiconductor structure generates light absorption of a quantum intersubband transition.

2. The photodetector according to claim 1, wherein a plurality of multilayer structures are arranged along a plane perpendicular to a stacking direction of the first layer, semiconductor structure layer, and second layer.

3. The photodetector according to claim 2, wherein the first layer is formed integrally over a plurality of the multilayer structures.

4. The photodetector according to claim 2, wherein the semiconductor structure layer is formed into separate pieces for a plurality of the multilayer structures, respectively.

5. The photodetector according to claim 2, wherein the semiconductor structure layer is formed continuously over a plurality of the multilayer structures.

6. The photodetector according to claim 2, further comprising first and second electrode pad parts for taking out the electron excited by the plasmon resonance;
    wherein a plurality of the multilayer structures include first and second multilayer structures having the respective second layers with widths different from each other along at least a predetermined direction in an interface between the semiconductor structure layer and the second layer; and
    wherein the first layer is electrically connected to the first electrode pad part; and
    wherein the second layers of the first and second multilayer structures are electrically connected to the common second electrode pad part.

7. The photodetector according to claim 2, further comprising a first electrode pad part and a plurality of second electrode pad parts for taking out the electron excited by the plasmon resonance;
    wherein a plurality of the multilayer structures include first and second multilayer structures having the respective second layers with widths different from each other along at least a predetermined direction in an interface between the semiconductor structure layer and the second layer; and
    wherein the first layer is electrically connected to the first electrode pad part; and wherein the second layers of the first and second multilayer structures are electrically connected to the respective second electrode pad parts different from each other.

* * * * *